US011677390B2

(12) United States Patent
Zhang et al.

(10) Patent No.: US 11,677,390 B2
(45) Date of Patent: Jun. 13, 2023

(54) MULTIMODE FREQUENCY MULTIPLIER

(71) Applicant: Qualcomm Incorporated, San Diego, CA (US)

(72) Inventors: Yan Zhang, Irvine, CA (US); Yunliang Zhu, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 65 days.

(21) Appl. No.: 17/238,173

(22) Filed: Apr. 22, 2021

(65) Prior Publication Data

US 2022/0352878 A1    Nov. 3, 2022

(51) Int. Cl.
*H03K 5/00* (2006.01)
*H03B 5/12* (2006.01)
(Continued)

(52) U.S. Cl.
CPC ....... *H03K 5/00006* (2013.01); *H03B 5/1221* (2013.01); *H03B 19/10* (2013.01);
(Continued)

(58) Field of Classification Search
CPC ........ H03B 19/00; H03B 19/10; H03B 19/14; H03B 5/00; H03B 5/1221; H03D 7/00; H03D 7/14; H03K 5/00; H03K 5/00006; H04B 1/00; H04B 1/0483; H04L 27/00; H04L 27/362
(Continued)

(56) References Cited

U.S. PATENT DOCUMENTS 6,768,356 B1 * 7/2004 Wu .............. H03L 7/0812
327/251
9,106,234 B2   8/2015 Zhu et al.
(Continued)

FOREIGN PATENT DOCUMENTS

CN    112350669 A    2/2021
EP    2360834 A2    8/2011

OTHER PUBLICATIONS

Bhat A., et al., "A 25-to-38GHz, 195dB FoMT LC QVCO in 65nm LP CMOS Using a 4-Port Dual-Mode Resonator for 5G Radios", 2019 IEEE International Solid-State Circuits Conference—(ISSCC), Feb. 20, 2019, pp. 412-413.
(Continued)

*Primary Examiner* — Diana J. Cheng
*Assistant Examiner* — Dave Mattison
(74) *Attorney, Agent, or Firm* — Colby Nipper/Qualcomm

(57) ABSTRACT

This disclosure describes apparatuses, methods, and techniques for implementing a multimode frequency multiplier. In example implementations, an apparatus for generating a frequency includes a multimode frequency multiplier. The multimode frequency multiplier includes a multiphase generator and a reconfigurable frequency multiplier. The multiphase generator is configured to produce a first signal including multiple phase components and having a first frequency. The reconfigurable frequency multiplier is coupled in series with the multiphase generator. The reconfigurable frequency multiplier is configured to produce a second signal based on the first signal and having a second frequency that is a multiple of the first frequency.

33 Claims, 14 Drawing Sheets

(51) Int. Cl.
*H03B 19/10* (2006.01)
*H03B 19/14* (2006.01)
*H03D 7/14* (2006.01)
*H04B 1/04* (2006.01)
*H04L 27/36* (2006.01)

(52) U.S. Cl.
CPC .............. *H03B 19/14* (2013.01); *H03D 7/14* (2013.01); *H04B 1/0483* (2013.01); *H04L 27/362* (2013.01)

(58) Field of Classification Search
USPC ........................................................ 327/116
See application file for complete search history.

(56) References Cited

U.S. PATENT DOCUMENTS

| | | | | |
|---|---|---|---|---|
| 9,473,115 | B2 | 10/2016 | Raj et al. | |
| 2007/0285307 | A1* | 12/2007 | Nishijima | G01S 7/03 342/200 |
| 2010/0052744 | A1* | 3/2010 | Fiedler | G11C 27/02 327/146 |
| 2013/0043924 | A1* | 2/2013 | Romeo | H03K 5/05 327/288 |
| 2016/0118964 | A1 | 4/2016 | Chueh et al. | |
| 2016/0126895 | A1* | 5/2016 | Rajendran | H04L 27/3405 330/251 |
| 2019/0393882 | A1 | 12/2019 | Bassi et al. | |
| 2020/0186175 | A1 | 6/2020 | Ben-Yishay | |
| 2020/0252070 | A1 | 8/2020 | Hirai et al. | |

OTHER PUBLICATIONS

Yoon H., et al., "A -31dBc Integrated-Phase-Noise 29GHz Fractional-N Frequency Synthesizer Supporting Multiple Frequency Bands for Backward-Compatible 5G Using a Frequency Doubler and Injection-Locked Frequency Multipliers", 2018 IEEE International Solid-State Circuits Conference, Feb. 14, 2018, pp. 366-367.
Partial International Search Report—PCT/US2022/071417—ISA/EPO—dated Jul. 25, 2022, 14 pages.
International Search Report and Written Opinion—PCT/US2022/071417—ISA/EPO—dated Nov. 2, 2022 21 pages.
Kim D., et al., "A Reconfigurable Multiphase $LC$-Ring Structure for Programmable Frequency Multiplication", IEEE Transactions on Circuits and Systems, II: Express Briefs, IEEE, USA, vol. 62, No. 1, Jan. 31, 2015, pp. 51-55, XP011566914, ISSN: 1549-7747, DOI: 10.1109/TCSII.2014.2362741 [retrieved on Jan. 1, 2015] figure 3a.

* cited by examiner

MULTIMODE FREQUENCY MULTIPLIER

TECHNICAL FIELD

This disclosure relates to wireless communications with electronic devices and, more specifically, to implementing a multimode frequency multiplier.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants (e.g., smart speakers), wireless access points or routers, thermostats and other sensors or automated controllers, robotics, automotive electronics, devices embedded in other machines like refrigerators and industrial tools, Internet of Things (IoT) devices, and so forth. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between two or more electronic devices using wireless or wired signals that are transmitted over one or more networks, such as the Internet, a Wi-Fi network, or a cellular network. Electronic communications, therefore, include both wireless and wired transmissions and receptions. To make such electronic communications, an electronic device can use a transceiver, such as a wireless transceiver for wireless communications.

Electronic communications can therefore be realized by propagating signals between two wireless transceivers at two different electronic devices. For example, using a wireless transmitter, a smartphone can transmit a wireless signal to a base station over an air medium as part of an uplink communication to support mobile services. Using a wireless receiver, the smartphone can receive a wireless signal that is transmitted from the base station via the air medium as part of a downlink communication to enable mobile services. With a smartphone, mobile services can include phone and video calls, social media interactions, messaging, watching movies, sharing videos, performing searches, acquiring map information or navigational instructions, finding friends, location-based services generally, transferring money, obtaining another service like a car ride, and so forth.

Many of these mobile services depend at least partly on the transmission and reception of wireless signals. Consequently, electrical engineers and other designers of electronic devices strive to develop wireless transceivers that can facilitate providing these and other mobile services by effectively communicating wireless signals.

SUMMARY

This document describes apparatuses, methods, and techniques for implementing a multimode frequency multiplier to efficiently generate multiple different frequencies. The multimode frequency multiplier can use a reduced number of voltage-controlled oscillators (VCOs) to cover a given range of frequencies or cover a wider range of frequencies with a same quantity of VCOs. This can reduce manufacturing cost, a size of an electronic device, an operating cost or power consumption, or a combination thereof. In example implementations, the multimode frequency multiplier can include a multiphase generator or a reconfigurable frequency multiplier, including both such components in some cases. A switch matrix circuit can couple the multiphase generator to the reconfigurable frequency multiplier. If the VCO operates at a fundamental frequency, a multimodal multiphase generator can selectively generate multiphase signals having the fundamental frequency or a subharmonic frequency thereof. The reconfigurable frequency multiplier can selectively multiply the frequency of the multiphase signals by at least two different factors. Consequently, in conjunction with a frequency tuning circuit, the multimode frequency multiplier can operate in multiple narrow frequency bands across an ultrawide frequency range.

In an example aspect, an apparatus for generating a frequency is disclosed. The apparatus includes a multimode frequency multiplier. The multimode frequency multiplier includes a multiphase generator configured to produce a first signal including multiple phase components and having a first frequency. The multimode frequency multiplier also includes a reconfigurable frequency multiplier coupled in series with the multiphase generator. The reconfigurable frequency multiplier is configured to produce a second signal based on the first signal and having a second frequency that is a multiple of the first frequency.

In an example aspect, an apparatus for generating a frequency is disclosed. The apparatus includes means for generating a first signal including multiple phase components and having a first frequency based on an oscillation signal having an oscillation frequency. The apparatus also includes means for multiplying, based on a factor of multiple factors, the first frequency of the first signal to produce a second signal having a second frequency that is a multiple of the first frequency.

In an example aspect, a method for generating a frequency is disclosed. The method includes first propagating of an oscillation signal having an oscillation frequency through a multimode frequency multiplier to produce a first signal having a first frequency. The first propagating includes generating multiple phase components having a third frequency. The first propagating also includes multiplying the third frequency by a first factor of multiple factors, with the first frequency being based on the third frequency and the first factor. The method also includes changing a state of at least one switch of the multimode frequency multiplier. The method further includes, responsive to the changing of the state, second propagating of the oscillation signal having the oscillation frequency through the multimode frequency multiplier to produce a second signal having a second frequency. The second propagating includes generating the multiple phase components having the third frequency. The second propagating also includes multiplying the third frequency by a second factor of the multiple factors, with the second frequency being based on the third frequency and the second factor.

BRIEF DESCRIPTION OF DRAWINGS

FIG. 4-1 illustrates an example circuit of a single-ended multimodal multiphase generator.

FIG. 4-2 illustrates an example circuit of a complementary multimodal multiphase generator.

FIG. 4-3 illustrates an example circuit of a differential multimodal multiphase generator.

FIG. 5-1 illustrates an example circuit of a reconfigurable frequency multiplier.

FIG. 5-2 illustrates an alternative configuration of the example circuit of the reconfigurable frequency multiplier of FIG. 5-1.

FIG. 8-1 is a flow diagram illustrating an example process for operating a multimode frequency multiplier to generate an output signal having a frequency that is two times (2×) an oscillation frequency of an input signal.

FIG. 8-2 is a flow diagram illustrating an example process for operating a multimode frequency multiplier to generate an output signal having a frequency that is three times (3×) an oscillation frequency of an input signal.

FIG. 8-3 is a flow diagram illustrating an example process for operating a multimode frequency multiplier to generate an output signal having a frequency that is one-and-a-half times (1.5×) an oscillation frequency of an input signal.

DETAILED DESCRIPTION

Overview

Figure 1:
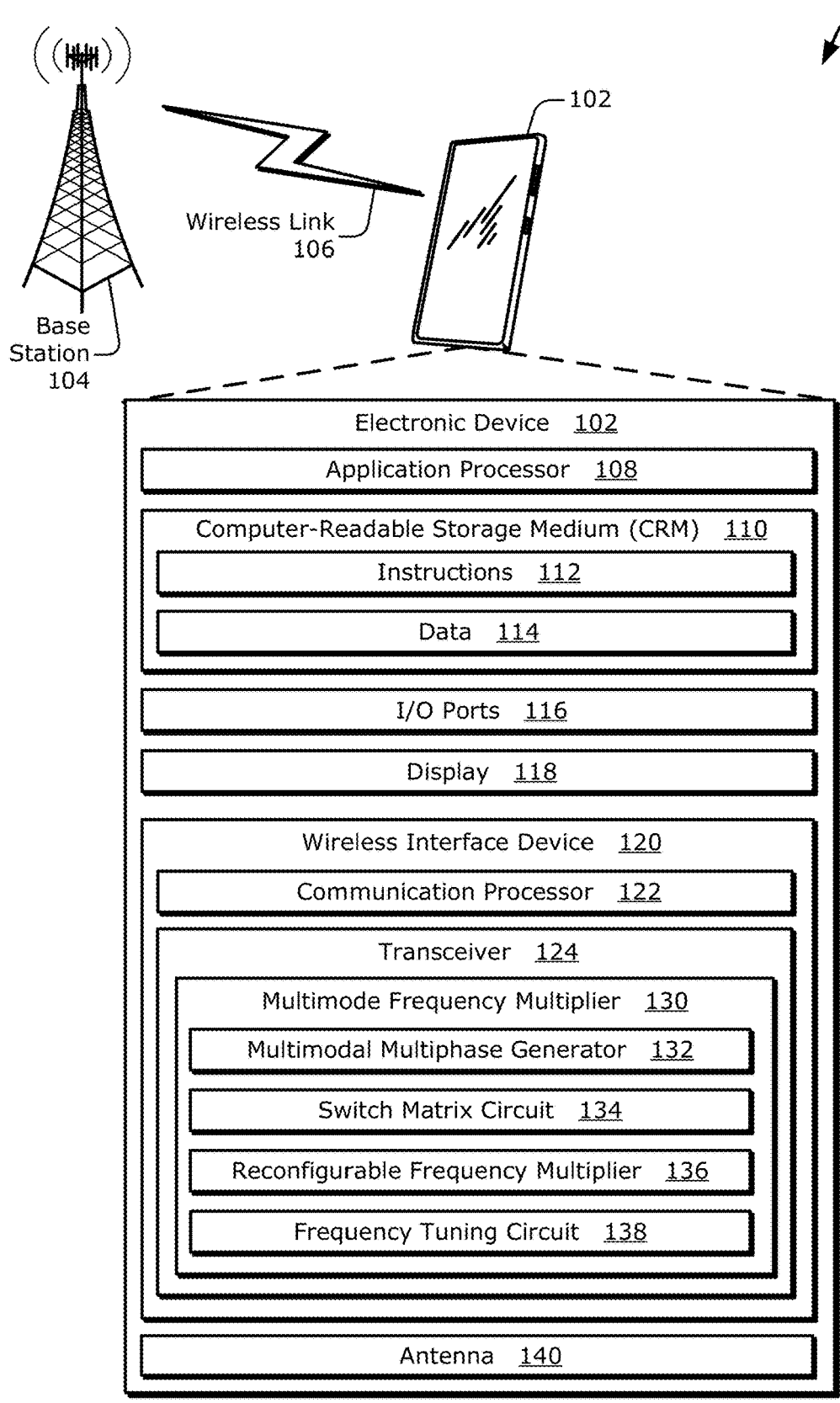
FIG. 1 illustrates an example environment that includes an electronic device with a wireless interface device, the wireless interface device having a transceiver that includes a multimode frequency multiplier.

To provide mobile services, electronic devices typically use a wireless transceiver to communicate wireless signals in accordance with some wireless standard. Examples of wireless standards include a 4th Generation (4G) cellular standard and an IEEE 802.11b or 802.11g Wi-Fi standard, which have both been used with smartphones and other connected devices. These wireless standards enable a certain wireless communication speed across a few frequency ranges. Efforts are ongoing, however, to enable faster wireless networks through the creation of newer wireless standards with a greater quantity or widths of frequency ranges to improve communication capabilities. Next-generation cellular networks and advanced Wi-Fi networks, for example, can offer significantly higher bandwidths, lower latencies, and access to additional electromagnetic (EM) spectrum. Taken together, this means that exciting new wireless services can be provided to users, such as safer self-driving vehicles, augmented reality (AR) and other mixed reality (MR) imaging, on-the-go 4K video streaming, ubiquitous sensors to keep people safe and to use natural resources more efficiently, real-time language translations, and so forth.

To make these new, faster wireless technologies more widely available, many wireless devices besides smartphones and other traditional computing devices will be deployed, which is sometimes called the "Internet of Things" (IoT). Compared to today's use of wireless devices, tens of billions, and eventually trillions, of more devices are expected to be connected to the internet with the Internet of Things. These IoT devices may include small, inexpensive, and low-powered devices, like sensors and tracking tags. Some portion of such IoT devices may therefore particularly benefit from smaller or less-expensive components.

Further, to enable next-generation wireless technologies, IoT devices and other electronic devices may operate in accordance with 5th Generation (5G) cellular standards and newer Wi-Fi standards. Such devices may communicate with signals that use wider frequency ranges that are located at higher frequencies of the EM spectrum as compared to those devices that operate in accordance with older wireless standards. For example, many newer devices will be expected to operate at millimeter-wave (mmWave) frequencies (e.g., frequencies between at least 24 and 300 Gigahertz (GHz)), as well as at frequencies in the single-digit GHz. These new wireless standards expand the range of frequencies at which electronic devices are permitted to communicate.

To meet these commercial expectations and accommodate the expansion of approved frequency ranges, the physical components that enable wireless communications under these constraints may be expected to operate over frequency ranges across tens of GHz. One component that facilitates electronic communication is the wireless interface device, which can include a wireless transceiver, a radio-frequency front-end (RFFE), or both. Newer wireless standards can operate at higher frequencies, can offer additional frequency ranges, and may involve more-stringent latency demands. These characteristics can be challenging for some wireless interface devices.

Further, as new wireless standards are developed and implemented, use of earlier standards can continue, such as for backward compatibility or utilization of existing electromagnetic (EM) frequency allocations. Previous or current wireless standards can also evolve to incorporate additional EM frequency allocations. Thus, both older and newer wireless standards may be associated with various frequency bands relative to each other and over time as the standards evolve. Electronic devices, therefore, may be designed to operate in accordance with different wireless standards, different generations of a given wireless standard, and/or otherwise across multiple frequency ranges. To operate across multiple frequency ranges or an ultrawide frequency range, a wireless interface device can include multiple different frequency oscillators, such as multiple voltage-controlled oscillators (VCOs), that provide oscillation signals at various oscillation frequencies that span a desired frequency range.

Replication of frequency oscillators, however, entails some costs. For example, each frequency oscillator instance is associated with a financial cost to replicate the various components for each desired frequency range. Additionally, each individual frequency oscillator occupies some finite amount of space, so each instance of a frequency oscillator causes a wireless interface device, and an electronic device thereof, to be larger. This consequence can conflict with a desired size of those devices in which smaller form factors may be preferred, such as an IoT sensor or a smartwatch. Further, each frequency oscillator that is operating consumes power, which can drain the battery of a mobile electronic device more quickly.

To address these issues, this document describes approaches to creating multiple different frequencies from a frequency oscillator. In operation, an oscillation signal with an oscillation frequency is applied to a multimode frequency multiplier. In example implementations, the multimode frequency multiplier can include a multiphase generator coupled to a reconfigurable frequency multiplier. The oscillation signal is propagated serially through the multiphase generator and the reconfigurable frequency multiplier. The multimode frequency multiplier outputs a signal having a frequency that is one of multiple selectable frequencies based on the oscillation frequency of the oscillation signal and at least one factor of multiple factors.

In some cases, described implementations can provide a range of frequencies that is comparable to other approaches that use more frequency oscillators, which occupy more area, cost more, and consume more power. In one relevant example, a frequency generation circuit as described herein can occupy approximately one-third less space and operate with one VCO instead of three as compared to the other approaches. In other cases, described implementations can offer a wider range of frequencies with a given quantity of frequency oscillators as compared to other approaches that use the same quantity of frequency oscillators. Thus, these described implementations can offer coverage across more frequency bands, including across additional wireless standards or channels, as compared to the other approaches. In another relevant example, for an equal quantity of VCOs, some described implementations can extend frequency coverage by approximately 60% without relying on additional space-occupying and power-hungry VCOs.

In additional example implementations, the multimode frequency multiplier can include a switch matrix circuit that couples the multiphase generator to the reconfigurable frequency multiplier. The switch matrix circuit can selectively couple different phase components of a signal from the multiphase generator to the reconfigurable multiplier. Additionally, the multiphase generator can be implemented as a multimodal multiphase generator to further increase an available quantity of frequency multipliers. Such a multimodal multiphase generator can, for instance, produce multiphase components of a signal having a fundamental frequency or a subharmonic thereof based on an oscillation signal having the fundamental frequency. This document also discloses a frequency tuning circuit that can enhance an output signal of the multimode frequency multiplier. These various components and features can be individually or jointly implemented to provide diverse frequency multiplication capabilities in manners that are more compact, that are less expensive, that operate with lower power, and/or that provide access to a wider frequency range as compared to other approaches.

Example Environment

FIG. 1 illustrates an example environment 100, which includes an electronic device 102 with a wireless interface device 120. The example electronic device 102 communicates with a base station 104 through a wireless link 106. FIG. 1 depicts the electronic device 102 as being a smartphone. The electronic device 102, however, may be implemented as any suitable computing or other electronic device. Examples of such other devices include a cellular base station, a broadband router, an access point, a gaming device, navigation device, a media device, a laptop computer, a desktop computer, a tablet computer, a computer server, a network-attached storage (NAS) device, a smart appliance, a vehicle-based communication system, an internet-of-things (IoT) device, a sensor, security device, an asset tracker, a fitness management device, a wearable device, a wireless power device, electronics of another apparatus, and so forth.

The base station 104 can communicate with the electronic device 102 via the wireless link 106, which may be implemented as any suitable type of wireless link that carries a communication signal. Although depicted as a base station tower of a cellular radio network, the base station 104 may represent or be implemented as another device (e.g., a satellite, a terrestrial broadcast tower, an access point, a peer-to-peer device, a mesh network node, a fiber-optic line, another electronic device, and so forth). Hence, the electronic device 102 may communicate with the base station 104 or another device using a wired connection, a wireless connection, or a combination thereof.

As shown, the wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project (3GPP) Long-Term Evolution (LTE) standard, such as a 4th Generation (4G) or a 5th Generation (5G) cellular standard; an IEEE 802.11 standard, such as 802.11g, ac, ax, ad, aj, or ay (e.g., Wi-Fi 6 or WiGig®); an IEEE 802.16 standard (e.g., WiMAX®); a Bluetooth® standard; other protocols and standards established or maintained by various governmental, industry, and/or academia consortiums, organizations, and/or agencies; and so forth. In some implementations, the wireless link 106 may provide power wirelessly, and the electronic device 102 or the base station 104 may comprise a power source.

The electronic device 102 can include at least one application processor 108 and at least one computer-readable storage medium 110 (CRM 110). The application processor 108 may include any type of processor, for example, a central processing unit (CPU) or a multi-core processor that is configured to execute processor-executable instructions (e.g., code) stored by the CRM 110. The CRM 110 may include any suitable type of data storage media, for example, volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102. Thus, the CRM 110 does not include transitory propagating signals or carrier waves.

The electronic device 102 may also include one or more input/output ports 116 (I/O ports 116) and/or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, camera, or other sensor ports, and so forth. The display 118 can be realized as a display screen or a projection that presents graphical images provided by the electronic device 102, for example, a user interface associated with an operating system (OS), program, or application. Alternatively and/or additionally, the display 118 may be implemented as a display port or virtual interface through which graphical content of the electronic device 102 can be communicated or presented.

The electronic device 102 also includes at least one antenna 140, which is coupled to the wireless interface device 120 of the electronic device 102. The wireless interface device 120 provides connectivity to respective networks and/or peer devices via a wireless link, which may be configured in a manner that is similar to or different from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, including a wireless LAN (WLAN), a wireless personal-area-network (WPAN), a peer-to-peer (P2P) network, a mesh network, a cellular network, wireless wide-area-network (WWAN), or a Satellite Positioning System (SPS) or Global Navigation Satellite System (GNSS) (e.g., Galileo, Global Positioning System (GPS), Quasi-Zenith Satellite System (QZSS), BeiDou, and GLObal NAvigation Satellite System (GLONASS)). In the context of the example environment 100, the electronic device 102 can communicate various data and control information bidirectionally with the base station 104 via the wireless interface device 120. The electronic device 102 may also communicate directly with other peer devices, an alternative wireless network, and the like.

As illustrated in FIG. 1, the wireless interface device 120 includes at least one communication processor 122 and at least one transceiver 124. Although not illustrated in FIG. 1, the wireless interface device 120 can also include a digital-to-analog converter (DAC) or an analog-to-digital converter (ADC) to convert between analog and digital signals. The DAC and the ADC can be implemented as part of the communication processor 122, as part of the transceiver 124, or separately from both. These components process data information, control information, and signals associated with communicating information for the electronic device 102 over the antenna 140.

The communication processor 122 of the wireless interface device 120 may be implemented in a system-on-chip (SoC), as a modem baseband processor, as a baseband radio processor (BBP), and so forth. The communication processor 122 enables a digital communication interface for data, voice, messaging, or other applications of the electronic device 102. In some implementations, the application processor 108 and the communication processor 122 can be combined into a module, an integrated circuit (IC), and/or an SoC. Regardless, the application processor 108 or the communication processor 122 can be operatively coupled to one or more other components, like the CRM 110 or the display 118, to enable control of, or other interaction with, the other components of the electronic device 102.

The communication processor 122 may also include a digital signal processor (DSP) or one or more signal-processing blocks for encoding and modulating data for transmission and for demodulating and decoding received data. Additionally, the communication processor 122 may include a memory to store data and processor-executable instructions (e.g., code), as in the example of the CRM 110. The communication processor 122 may operate (e.g., control or configure) aspects of the transceiver 124, such as the multimode frequency multiplier 130 and other components of the wireless interface device 120, to implement various communication protocols or communication techniques.

As illustrated, the transceiver 124 of the wireless interface device 120 includes a multimode frequency multiplier 130. The transceiver 124 can also include circuitry and logic for filtering, amplification, channelization, frequency translation, and so forth. The frequency translation may include a frequency up-conversion or a frequency down-conversion that may be performed in a single conversion operation, or through multiple conversion operations, using at least one local oscillator (LO), which may include or operate in conjunction with a voltage-controlled oscillator (VCO) (not shown in FIG. 1). The VCO may be included as part of the multimode frequency multiplier 130, may be disposed in a separate IC, may be part of the transceiver 124 but separate from the multimode frequency multiplier 130, or may be incorporated elsewhere in the electronic device 102.

In detail, the transceiver 124 can include filters, switches, amplifiers, mixers, and so forth, for routing and conditioning signals that are transmitted or received via the antenna 140, as is further described with reference to FIG. 2. The components or circuitry of the transceiver 124 can be implemented in any suitable fashion, for example, as combined transceiver logic or separately as respective receiver and transceiver units. In some cases, the transceiver 124 may be implemented with multiple or different sections to implement respective receiving and transmitting operations (e.g., separate transmit and receive chains). The transceiver 124 may also include logic to perform in-phase/quadrature (I/Q) operations (e.g., synthesis, phase correction, phase shifting, modulation, demodulation, and the like).

Although not shown in FIG. 1, the wireless interface device 120 may include a radio-frequency (RF) front-end. The RF front-end can include one or more filters, switches, amplifiers, or mixers for conditioning signals received via the antenna 140 or signals to be transmitted via the antenna 140. The RF front-end may include a phase shifter (PS), peak detector, power meter, gain control block, antenna tuning circuit, N-plexer, balun, and the like. An RF front-end can, however, additionally or alternatively include other components, such as the multimode frequency multiplier 130. Configurable components of the RF front-end, such as a phase shifter, multimode frequency multiplier 130, or automatic gain controller (AGC), may be controlled by the communication processor 122 to implement communications in various modes, with different frequency bands, or using beamforming.

Figure 2:
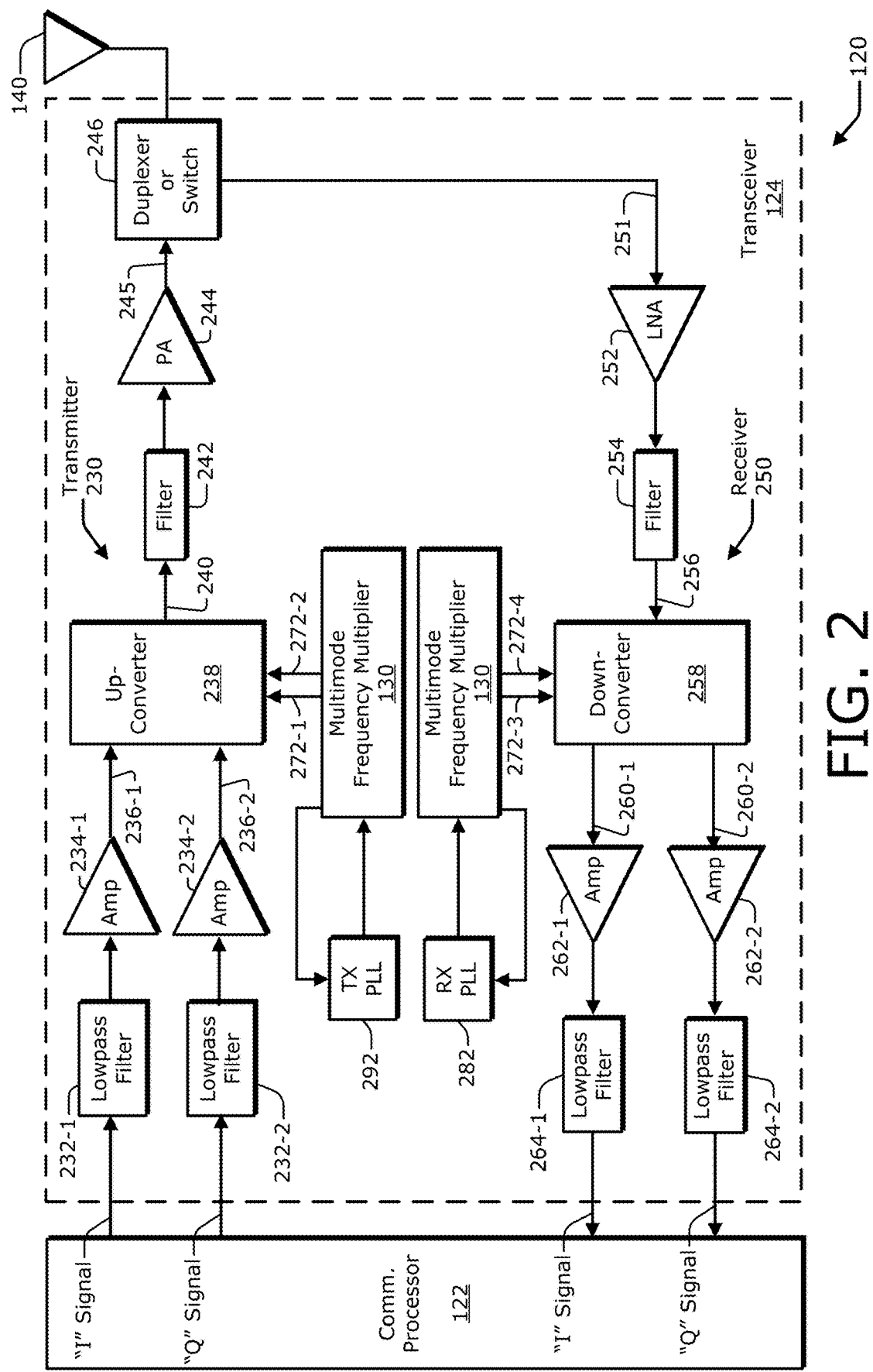
FIG. 2 illustrates an example architecture of the wireless interface device of FIG. 1.

Generally, the components depicted in FIGS. 1 and 2 can be distributed between the transceiver 124 and an RF front-end, including as part of at least one antenna module. For example, the transceiver 124 can include a portion of these components, and the RF front-end can include another portion of these components, such as the remaining components. In some implementations, the antenna 140 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In example implementations, the multimode frequency multiplier 130 of the transceiver 124 can facilitate the frequency up-conversion or the frequency down-conversion operation in at least one frequency range. Compared to other approaches in ultrawide frequency band(s), the multimode frequency multiplier 130 can support ultrawide frequency communications while using a reduced number of VCOs. The multimode frequency multiplier 130 can include at least one multimodal multiphase generator 132 (or multiphase generator 132), optionally at least one switch matrix circuit 134, at least one reconfigurable frequency multiplier 136 (or reconfigurable multiplier 136), and optionally at least one frequency tuning circuit 138. By using a reduced number of VCOs, manufacturers can, for example, reduce silicon area and decrease manufacturing costs without sacrificing signal quality and/or without decreasing the frequency band(s) that are available for communication.

FIG. 2 illustrates an example architecture of the wireless interface device 120 in which aspects of the present disclosure may be implemented. In FIG. 2, the wireless interface device 120 includes the communication processor 122 (illustrated as "comm. processor 122") and the transceiver 124. The transceiver 124 includes a transmitter 230 and a receiver 250 that jointly support bi-directional communication. In general, the wireless interface device 120 may include any quantity of transmitters and any quantity of receivers for any number of communication systems or frequency bands. All or a portion of the transceiver 124 may be implemented on one or more analog ICs, radio-frequency integrated circuits (RFICs), mixed-signal ICs, and so forth. Herein, the term "transceiver" functionally describes some elements of the wireless interface device 120. Some of the elements illustrated in the transceiver 124 may be included in a transceiver chip, module, or circuit, while other elements illustrated in the transceiver 124 may be implemented separately in a radio-frequency front-end (RFFE) circuit, as discrete components, in a separate module, and so forth.

The transmitter 230 or the receiver 250 may be implemented with a super-heterodyne architecture or a direct-conversion architecture. In the super-heterodyne architecture, a signal is frequency-converted between radio frequency (RF) and baseband in multiple stages. For example, the super-heterodyne architecture may convert the signal frequency from RF to an intermediate frequency (IF) in one stage, then from IF to baseband frequency in another stage. Thus, when utilizing the super-heterodyne architecture, there can be one or multiple IF conversion stages between RF and baseband frequency. In contrast, the direct-conversion architecture, certain embodiments of which may be referred to as zero-IF (ZIF or OZIF), converts the signal frequency between RF and baseband frequency in one (1) stage. The super-heterodyne and direct-conversion architectures may use different circuit blocks or have different technical specifications. For ease of description and illustration, in FIG. 2 the transmitter 230 and the receiver 250 are implemented with a direct-conversion architecture by way of example. Nonetheless, the components described with reference to FIG. 2 are applicable to super-heterodyne and/or direct-conversion architectures. Thus, the principles described herein for the multimode frequency multiplier 130 are applicable to both direct-conversion and super-heterodyne architectures.

As illustrated in FIG. 2, a phase-locked loop (PLL) and a multimode frequency multiplier 130 are used with the transmitter 230 and the receiver 250. A transmit PLL 292 (TX PLL 292) and an associated multimode frequency multiplier 130 generate I and Q LO signals (e.g., a 272-1 I signal and a 272-2 Q signal). These TX LO signals are used for frequency up-conversion in the transmitter 230. A receive PLL 282 (RX PLL 282) and an associated multimode frequency multiplier 130 generate I and Q LO signals (e.g., a 272-3 I signal and a 272-4 Q signal). These RX LO signals are used for frequency down-conversion in the receiver 250. Generally, the "I" and "Q" signals may be referred to as multiphase signals, multiphase components, phase components, and so forth. Although not so shown in FIG. 2, each signal may be realized as a differential signal having a plus part and a minus part. In some embodiments, a multimode frequency multiplier 130 may be coupled to both the up-converter 238 and the down-converter 258.

Each of the LO signals 272-1, 272-2, 272-3, and 272-4 can be realized as a multiphase fundamental frequency or a multiphase subharmonic frequency, as is further described below. In operation, the TX PLL 292 receives timing information from the communication processor 122 and generates a control signal that is used to adjust a frequency, or a phase, of the TX LO signals 272-1 and 272-2, which are generated by the associated multimode frequency multiplier 130. Similarly, the RX PLL 282 receives timing information from the communication processor 122 and generates a control signal that is used to adjust a frequency or a phase of the RX LO signals 272-3 and 272-4, which are generated by the associated multimode frequency multiplier 130.

In the transmit path, the communication processor 122 processes data to be transmitted and provides I and Q analog output signals (illustrated as "I" signal and "Q" signal) to the transmitter 230. The communication processor 122 may include one or more DACs (not illustrated) for converting signals generated by the communication processor 122 into the I and Q analog output signals, for example, into I and Q output currents and/or voltages, for further processing by the transmitter 230. In other embodiments, the communication processor 122 provides digital signals to one or more DACs (not illustrated) in the transmitter 230 such that the I and Q analog output signals are generated in the transmitter 230. Within the transmitter 230, lowpass filters 232-1 and 232-2 filter the I and Q analog output signals, respectively, to remove undesired signal images caused by the prior DACs. Amplifiers 234-1 and 234-2 (Amp 234-1 and Amp 234-2) amplify the analog signals received from the lowpass filters 232-1 and 232-2, respectively, and produce I and Q baseband signals 236-1 and 236-2, respectively.

An up-converter 238 in the transmit path up-converts the I and Q baseband signals 236-1 and 236-2 using the I and Q LO signals 272-1 and 272-2, which are generated by the multimode frequency multiplier 130 of the transmit path. Based on the I and Q signals 272-1 and 272-2, the up-converter 238 produces an up-converted signal 240. After the frequency up-conversion, a filter 242 filters the up-converted signal 240 and removes images and noise caused by the frequency up-conversion in a transmit frequency band. Then, a power amplifier 244 (PA 244) amplifies an output of the filter 242 to attain a desired output power level and produces a transmit RF signal 245. The transmit RF signal 245 is routed through a duplexer or switch 246. In the example transmit operation, the antenna 140 transmits an output signal of the duplexer or switch 246.

In the receive path for an example receive operation, the antenna 140 receives signals transmitted by the base station 104, other wireless communication devices, and the like. The antenna 140 provides a received RF signal 251, which is routed through the duplexer or switch 246. The duplexer or the switch 246 delivers the received RF signal 251 to a low-noise amplifier 252 (LNA 252) of the receiver 250. The LNA 252 amplifies the received RF signal 251 and delivers the received and amplified RF signal to a filter 254. The filter 254 filters the received and amplified RF signal to generate an RF input signal 256.

The filter 254 provides the RF input signal 256 to a downconverter 258 in the receive path. The downconverter 258 in the receive path down-converts a frequency of I and Q versions of the RF input signal 256 to produce down-converted I and Q baseband signals 260-1 and 260-2. The downconverter 258 uses the I and Q LO signals 272-3 and 272-4 generated by the multimode frequency multiplier 130 of the receive path. Based on the signals 272-3 and 272-4, the downconverter 258 produces the down-converted I and Q baseband signals 260-1 and 260-2. The I and Q baseband signals 260-1 and 260-2 are amplified by respective amplifiers 262-1 and 262-2 (Amp 262-1 and Amp 262-2). These amplified I and Q baseband signals are further filtered by respective lowpass filters 264-1 and 264-2 to obtain I and Q analog input signals (illustrated as "I" signal and "Q" signal), which may be provided to the communication processor 122. The communication processor 122 may include one or more ADCs (not illustrated) for converting the analog input signals into digital signals to be further processed by the communication processor 122. In other embodiments, the receiver 250 includes one or more ADCs (not illustrated) configured to convert the analog input signals into digital signals, and the receiver 250 provides the digital signals to the communication processor 122.

Each antenna 140 may be realized as an antenna array having multiple antenna elements or as an antenna element that is part of an antenna array. Further, in some implementations, multiple antennas are coupled to the transceiver 124 instead of a single antenna 140. These multiple antennas may be used with shared or separate transceiver chains (e.g., concurrently, non-concurrently, or in separate modes) for beamforming, carrier aggregation, multiple-input and multiple-output (MIMO) scenarios, diversity, and so forth. Thus, each of the antennas may be coupled to one or more receive or transmit chains. Generally, each antenna 140 may be coupled to transmit or receive circuitry as described above or in an alternative manner. The components of FIG. 2 may be coupled together differently than is illustrated or may operate in alternative orders than those that are described. For example, the downconverter 258 can precede (e.g., can be closer to the antenna 140 than) the LNA 252 and the filter 254 in a "mixer-first" receiver architecture in which the downconverter 258 operates on a signal prior to the LNA 252 or the filter 254. Further, while examples discussed herein utilize I and Q signals, those of skill in the art will understand that components of the transceiver may be configured to utilize polar modulation.

Multimode Frequency Multiplier

Figure 3:
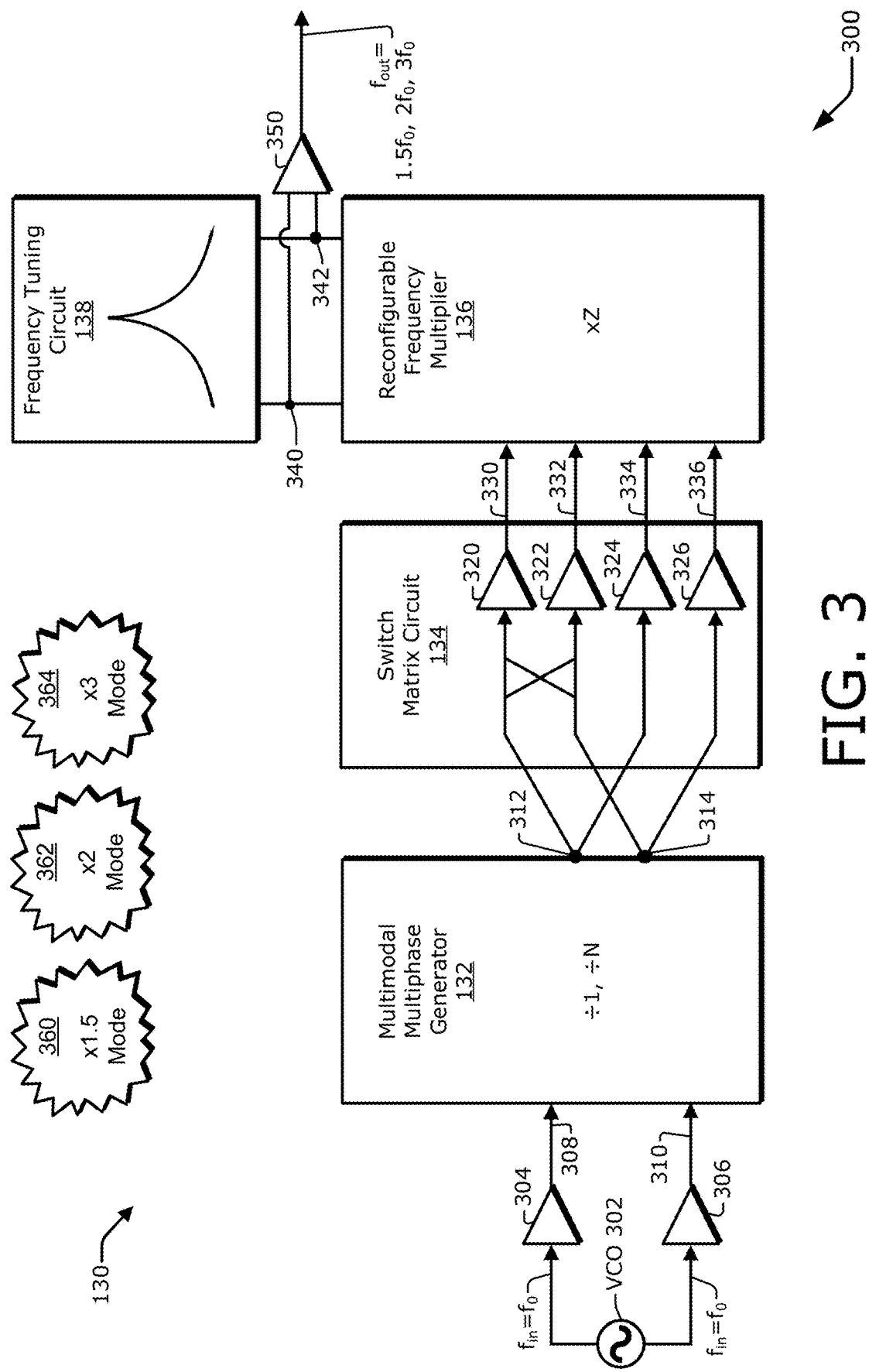
FIG. 3 illustrates an example architecture of the multimode frequency multiplier of FIG. 1 including a multimodal multiphase generator, a switch matrix circuit, a reconfigurable frequency multiplier, and a frequency tuning circuit.

FIG. 3 illustrates an example architecture 300 of the multimode frequency multiplier 130. The multimode frequency multiplier 130 can include the multimodal multiphase generator 132, the switch matrix circuit 134, the reconfigurable multiplier 136, and the frequency tuning circuit 138. As illustrated in FIG. 3, a voltage-controlled oscillator 302 (VCO 302) generates input signals with frequency $f_{in}$ equal to a fundamental frequency $f_0$ (illustrated $f_{in}=f_0$). For example, the VCO 302 may be included in the PLL 282 or the PLL 292 (of FIG. 2). Although this document describes some theoretical circuit relationships using equations and comparable language, values in physical devices may be approximate (e.g., approximately equal or approximately a multiple of another value) due to deviations from ideal circuit parameters, variabilities in circuit components during fabrication, lack of accurate or precise measurements, and so forth. The multimode frequency multiplier 130 supplies the input signals to VCO-associated buffers 304 and 306 and provides signals 308 and 310 with frequency $f_0$ to the multimodal multiphase generator 132. Although the multimode frequency multiplier 130 that is depicted in FIG. 3 can include the buffers 304 and 306, a multimode frequency multiplier 130 generally can omit these buffers. These buffers may be omitted altogether in some embodiments, or such buffers may be implemented as part of the VCO 302 or otherwise in the PLL in some embodiments.

In example implementations, a multiphase generator 132 can be realized using a multimodal multiphase generator 132. The multimodal multiphase generator 132 may operate as a divide-by-one or as a divide-by-N multiphase generator, where N is an integer equal or greater than two (2) (or greater than one (1)). In a first division mode (e.g., a fundamental mode), the multimodal multiphase generator 132 operates as the divide-by-one multiphase generator and outputs signals 312 and 314 with frequencies approximately equal to $f_{in}$ (or the fundamental frequency $f_0$), wherein $f_{312}$ and $f_{314}$ denote the frequencies of the signals 312 and 314, respectively. In a second division mode (e.g., a subharmonic mode), the multimodal multiphase generator 132 operates as the divide-by-N multiphase generator and outputs the signals 312 and 314 with frequencies $f_{312}$ and $f_{314}$, which are approximately equal to one-Nth of the frequency of the input signals (or one-Nth of the input frequency $f_{in}$). Equation 1 illustrates frequencies $f_{312}$ and $f_{314}$ of the fundamental mode, and Equation 2 illustrates $f_{312}$ and $f_{314}$ of the subharmonic mode of the multimodal multiphase generator 132.

$$f_{312} = f_{314} = f_{in} = f_0 \qquad \text{Equation 1}$$

$$f_{312} = f_{314} = \frac{f_{in}}{N} = \frac{f_0}{N} \qquad \text{Equation 2}$$

For ease of description and for clarity, this document focuses on the multimodal multiphase generator 132 operating as a divide-by-one multiphase generator (as shown in Equation 1) or as a divide-by-two multiphase generator, as is further described in FIGS. 4-1, 4-2, and 4-3. Equation 3 illustrates frequencies $f_{312}$ and $f_{314}$ of the divide-by-two multiphase generator.

$$f_{312} = f_{314} = \frac{f_{in}}{2} = \frac{f_0}{2} \qquad \text{Equation 3}$$

Whether the multimodal multiphase generator 132 operates in the fundamental or the subharmonic mode, the signals 312 and 314 can be realized as multiphase signals. Examples of multiphase signals or multiphase components are in-phase (I) signals and quadrature (Q) signals, with phases ninety degrees (90°) apart from each other. In some such embodiments, the multimodal multiphase generator 132 outputs two signals (I, Q), and in some such embodiments the multimodal multiphase generator 132 outputs four signals (I+, I−, Q+, Q−), for example as described in greater detail below. Depending on the architecture, however, the multimodal multiphase generator 132 may generate multiphase signals with phases other than 90° apart from each other. For example, the multimodal multiphase generator 132 may output signals with phases 60° apart or 45° apart from each other. In some such embodiments, the multimodal multiphase generator 132 is configured to output more than four signals (e.g., eight (8) signals in certain embodiments in which the output signals have phases 45° apart). In some embodiments, a greater number of output signals is associated with a greater number of (or a higher) divide ratios (and/or a greater number of multiply modes, which are described below). Also, in some cases, the multiphase generator 132 may instead implement one mode, such as a divide-by-one mode but not a divide-by-two one or a divide-by-two mode but not a divide-by-one mode.

The multimode frequency multiplier 130 can utilize the reconfigurable frequency multiplier 136 to multiply the frequencies of the signals 312 and 314 by a varying factor Z. Here, the factor Z is an integer equal or greater than two (2) (or an integer greater than one (1)) and can vary depending on a present configuration of the reconfigurable multiplier 136. For ease of description and for clarity, this disclosure focuses on the reconfigurable multiplier 136 operating as a multiply-by-two or as a multiply-by-three reconfigurable multiplier, as is further described in FIGS. 5-1 and 5-2. When selecting between multiplying by two or multiplying by three, the multimode frequency multiplier 130 can utilize the switch matrix circuit 134 to swap destinations for multiphase components. To do so, the switch matrix circuit 134 uses buffers 320, 322, 324, and 326 to generate signals 330, 332, 334, and 336, respectively. The capability to swap the signals 330 and 332, for example, enable the reconfigurable multiplier 136 to operate as a multiplying-by-two or as a multiplying-by-three reconfigurable multiplier 136, as is further described in Table 1 and with reference to FIG. 6.

Figures 1, 4:
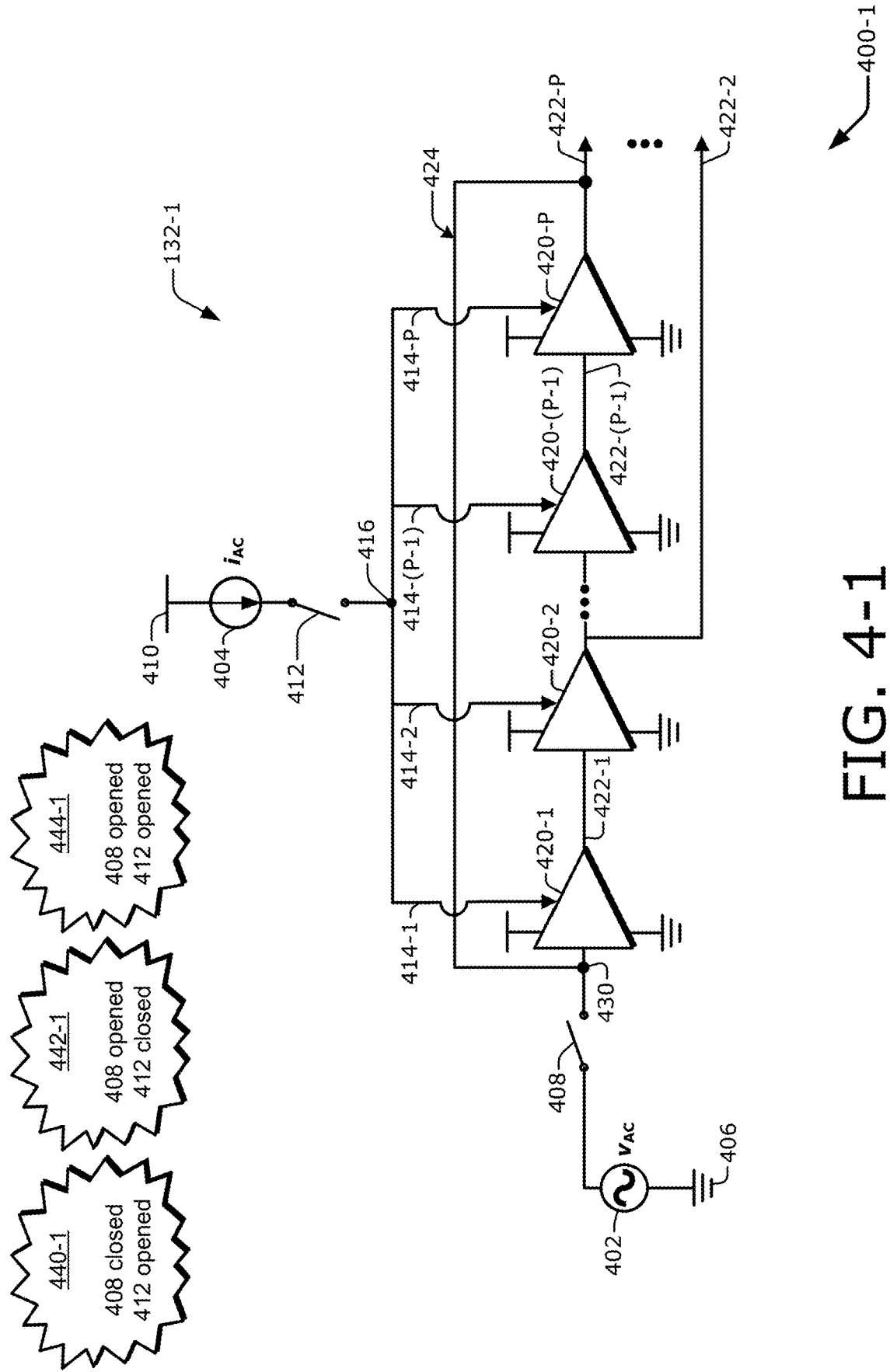
Figures 2, 4:
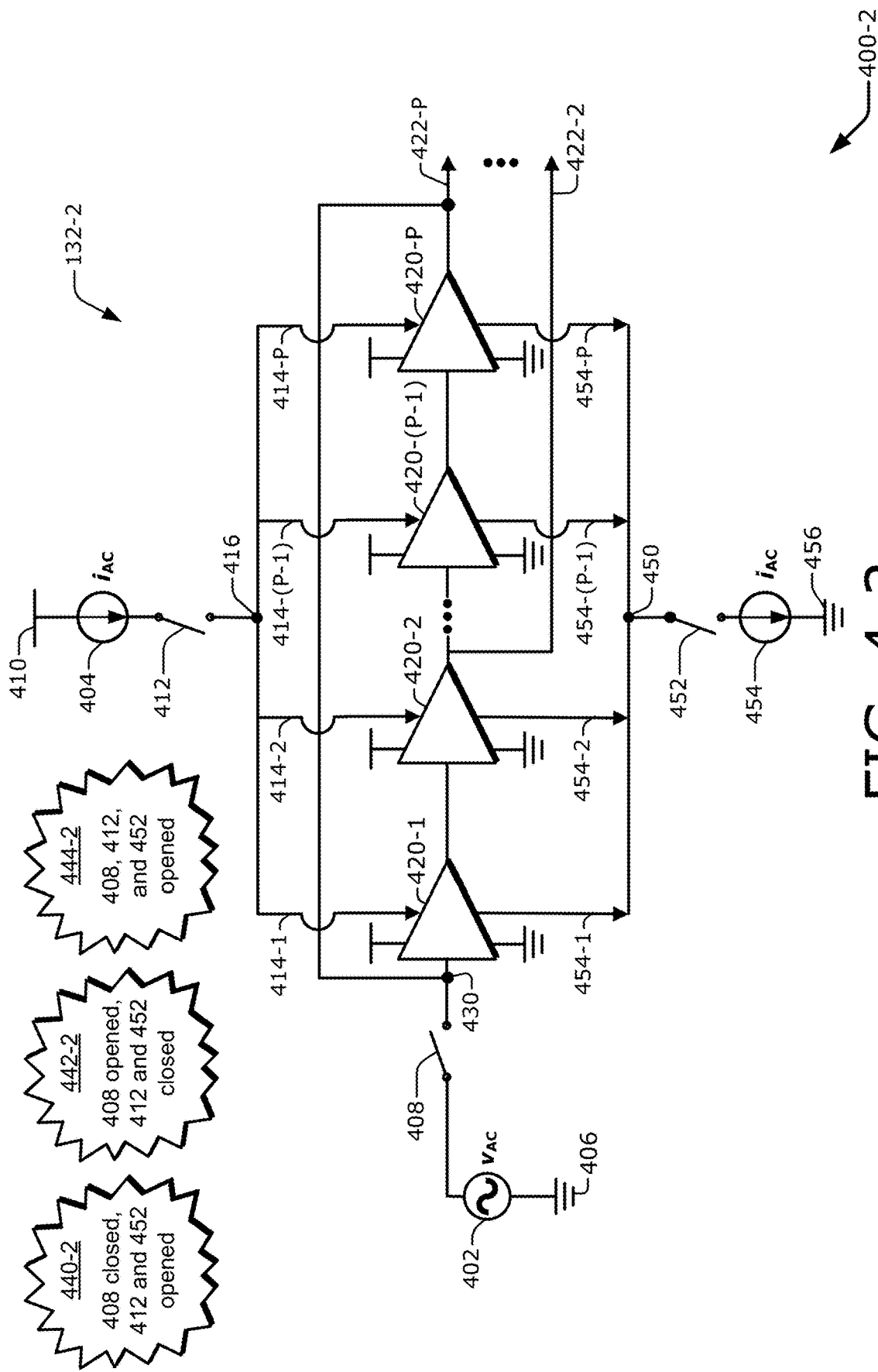
Figures 3, 4:
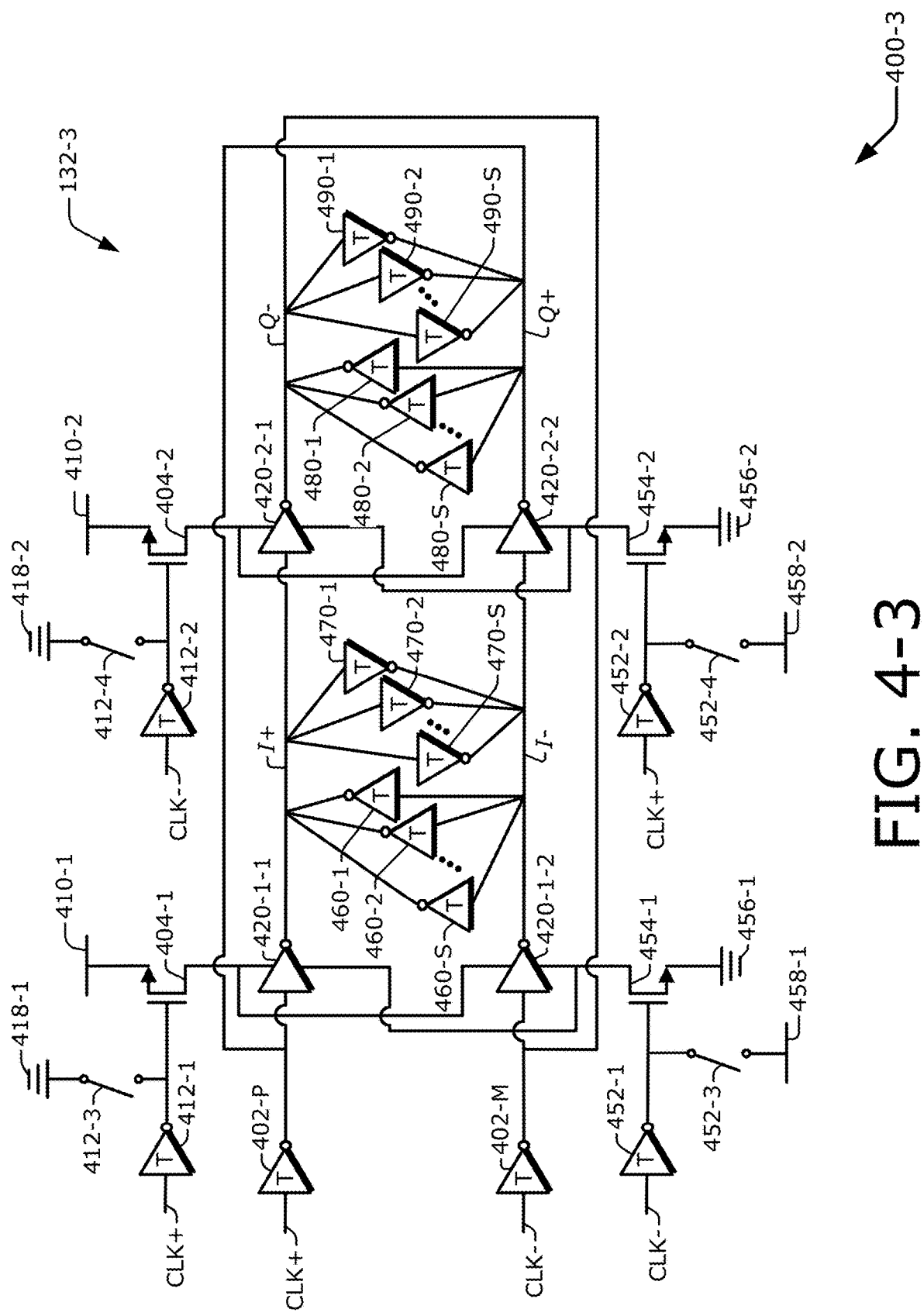
Figure 7:
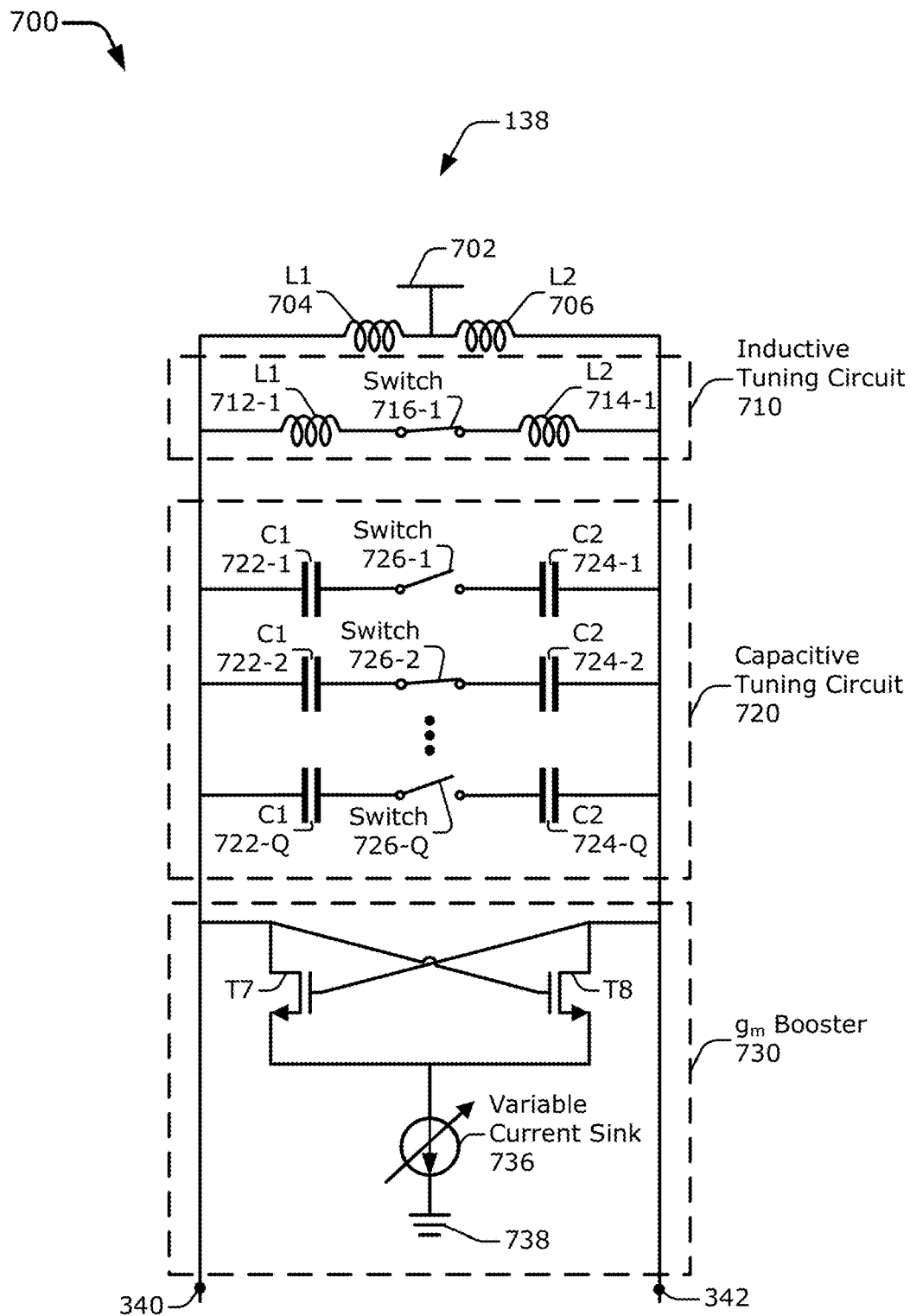
FIG. 7 illustrates an example implementation of the frequency tuning circuit that can be coupled to the reconfigurable frequency multiplier.

In some aspects, by combining some of the techniques and descriptions of FIGS. 4-1 to 7, Equations 1 to 3, and Table 6, the multimode frequency multiplier 130 can generate an output signal with an output frequency $f_{out}$ that can vary appreciably. The multimode frequency multiplier 130 can supply the output signal with frequency $f_{out}$ using a buffer 350. Specifically, assuming $f_{in}=f_0$; N=2 or N=1; and Z=2 or Z=3, the multimode frequency multiplier 130 can operate in at least three different modes. Examples of such modes are indicated by Equations 4 to 6 for $$f_{out} = \frac{f_0}{N} \cdot Z:$$

a multiply-by-one-and-a-half mode 360 (×1.5 mode 360), wherein:

$$f_{out} = \frac{f_0}{2} \cdot 3 = 1.5 \cdot f_0; \qquad \text{Equation 4}$$

a multiply-by-two mode 362 (×2 mode 362), wherein:

$$f_{out} = \frac{f_0}{1} \cdot 2 = 2 \cdot f_0; \qquad \text{Equation 5}$$

or a multiply-by-three mode 364 (×3 mode 364) mode, wherein:

$$f_{out} = \frac{f_0}{1} \cdot 3 = 3 \cdot f_0. \qquad \text{Equation 6}$$

With the multiple modes of operation of the multimode frequency multiplier 130 (e.g., modes 360, 362, and 364), the frequency of the output signal $f_{out}$ can cover a wide or ultra-wide frequency band (e.g., K band at 18-27 GHz). Further, to attain a particular frequency of the output signal with frequency $f_{out}$, the reconfigurable frequency multiplier 136 can be coupled to the frequency tuning circuit 138 using nodes 340 and 342. An example schematic of the frequency tuning circuit 138 is described with reference to FIG. 7. The output signal having frequency $f_{out}$ may be provided as one of the signals 272 (of FIG. 2). In some embodiments, these signals 272 may be used by the up-converter 238 to convert baseband signals to IF prior to further upconversion to a mmWave frequency in a super-heterodyne architecture, or these signals 272 may be used by the down-converter 258 to convert IF signals, which were already downconverted from a mmWave frequency, to baseband.

Multimodal Multiphase Generator

FIG. 4-1 illustrates an example architecture 400-1 of a single-ended multimodal multiphase generator 132-1, which is an example architecture of the multimodal multiphase generator 132 of FIG. 3. As discussed first with reference to the single-ended multimodal multiphase generator 132-1, the multimodal multiphase generator 132 (of FIG. 3) can include a signal path, or at least one signal path, that is coupled to at least one buffer 420 of multiple buffers that are coupled together in series. The signal path, or each signal path, can correspond to an oscillation signal having an oscillation frequency. As described below, the at least one signal path can include a first signal path and a second signal path. The first signal path can inject an oscillation frequency via at least one current. The second signal path can inject an oscillation frequency via at least one voltage. Such first and second signal paths can also be included with a complementary multimodal multiphase generator 132-2, which is described with reference to FIG. 4-2, or a differential multimodal multiphase generator 132-3, which is described with reference to FIG. 4-3.

In addition to (or instead of) generating one or more subharmonic frequencies (e.g., $$\frac{f_0}{2})$$

by utilizing "injection locking," the multimodal multiphase generator 132-1 can generate a fundamental frequency $f_0$. To do so, the multimodal multiphase generator 132-1 includes or is coupled to an alternating-current (AC) voltage source 402 (voltage source 402 or $v_{AC}$ 402) and/or an AC current source 404 (current source 404 or $i_{AC}$ 404). The voltage source 402 can, for instance, correspond to the VCO 302 of FIG. 3, including being fed by the VCO 302. As illustrated, the voltage source 402 can be coupled between a ground node 406 (e.g., where $V_{SS}=0$ V) and a switch 408. The current source 404 can be coupled between a supply voltage 410 (e.g., where $V_{DD}=0.95$ V) and a switch 412, which is coupled to a splitting node 416.

In example implementations, the splitting node 416 facilitates input control signals 414-1, 414-2, ..., 414-(P−1), and 414-P being applied or forwarded to buffers 420-1, 420-2, ..., 420-(P−1), and 420-P, respectively. The buffers 420-1, 420-2, ..., 420-(P−1), and 420-P are coupled together in series and generate output signals 422-1, 422-2, ..., 422-(P−1), and 422-P, respectively. Each buffer 420 can be implemented as an inverting buffer, as a noninverting buffer, as at least one inverter, and so forth. As illustrated in FIG. 4-1, the output signal of one buffer is applied as an input signal to another, succeeding buffer. With a connection from an output terminal of a "final" buffer 420 to an input terminal of an "initial" buffer 420, the multiple buffers 420-1 to 420-P form a loop 424, or oscillating ring. In the loop 424, a node 430 (or corresponding signal) and a signal 422-P (or corresponding node) may be coupled together. Also, the variable P can denote an odd integer for single-ended circuitry of an oscillating ring, where all buffers are inverting (e.g., as inverting buffers or as being formed from inverters). Under some conditions, with sufficient injection power, a single-ended oscillating ring with an even P quantity of buffers can also work to generate multiple phases. A manufacturer, however, can design an oscillating ring with double-ended circuitry (instead of single-ended circuitry) for use as part of the multimodal multiphase generator 132. In such cases, the variable P can denote an even integer, and the buffers can be either inverting or non-inverting.

In an example, the switches 408 and 412 facilitate three configurations 440-1, 442-1, and 444-1 of the multimodal multiphase generator 132-1. To operate in the fundamental mode, the configuration 440-1 places the switch 408 in a closed state and places the switch 412 in the open state. The configuration 440-1 enables an injection of voltage from the voltage source 402 and disables an injection of current from the current source 404. This mode of operation generates a multiphase fundamental frequency $f_0$ output. Throughout this description, the terms "first division mode," "divide-by-one," "fundamental mode," and/or "configuration 440-1" can be used interchangeably with respect to the multimodal multiphase generator 132, depending on the context of the description, linguistic choice, and/or other factors. Thus, in the fundamental mode, the frequency of an oscillating signal as represented by the voltage source 402 is injected into the loop 424 using a voltage-based signal.

In more detail, assuming the voltage source 402 generates an input signal with a frequency $f_0$, the frequency of a signal at node 430 is $f_0$, and the frequency of a signal in the loop 424 is also $f_0$. As is illustrated in FIG. 4-1, in the fundamental mode, the voltage injection can occur at one input terminal of one buffer 420 (e.g., a second buffer or the buffer 420-1) and not at the other buffers (e.g., buffers 420-2, . . . , 420-(P–1), and 420-P) because the switch 412 is open. Consequently, a mixing of frequencies occurs at the node 430, and the loop 424 can filter-out at least some undesired $2f_0$ frequencies. As such, the frequency of the output signal 422-P is approximately equal to the frequency of the input frequency as generated by the voltage source 402. Further, the frequency of the output signal 422-2, for instance, also substantially equals the frequency of the input frequency as generated by the voltage source 402. Nevertheless, a phase of the output signal 422-P can differ from a phase of the output signal 422-2, for example, by 90°. While only the signals 422-2 and 422-P are explicitly illustrated as being provided outside of the multimodal multiphase generator 132-1, it will be understood that the other signals 422-1 and 422-3 to 422-(P–1) may be provided outside of the multimodal multiphase generator 132-1

To operate in the subharmonic mode, the configuration 442-1 has the switch 408 in the open state and has the switch 412 in the closed state. The configuration 442-1 disables the injection of voltage from the voltage source 402 and enables the injection of current from the current source 404. This mode of operation can generate a multiphase subharmonic frequency, as is illustrated in Equations 2 and 3. Throughout this disclosure, the terms "second division mode," "divide-by-N," "divide-by-two," "subharmonic mode," "injection locking," and/or "configuration 442-1" can be used interchangeably relative to multimodal multiphase generator 132, depending on the context, stylistic preference, and/or other factors. In one aspect, the multimodal multiphase generator 132-1 sets a self-oscillation frequency close to a target frequency, where the target frequency is a subharmonic output frequency (e.g., $$\frac{f_0}{2}).$$

To do so, the multimodal multiphase generator 132-1 sets a frequency of the VCO using the current source 404 to $f_0$. When the current source 404 injects current with frequency $f_0$ at a control terminal of a buffer 420 (e.g., using an input control signal 414-1, 414-2, . . . , 414-(P–1), or 414-P), the signal with frequency $f_0$ mixes with the self-oscillation frequency $$\frac{f_0}{2}$$

to generate signals with frequency $$\frac{f_0}{2}$$

at an output terminal of at least one buffer 420 (e.g., a first buffer such as the buffer 420-1, the buffer 420-2, or the buffer 420-P) (e.g., as output signals 422-1, 422-2, . . . , 422-(P–1), and 422-P). In this manner, the multimodal multiphase generator 132-1 can sustain a signal with a frequency (or tone)

$$\frac{f_0}{2}$$

in the loop 424. Thus, in the subharmonic mode, the frequency of an oscillating signal as represented by the current source 404 is injected into the loop 424 using a current-based signal.

To operate the loop 424 as a "pure" ring oscillator for the configuration 444-1, the multimodal multiphase generator 132-1 opens the switch 408 and opens the switch 412. The configuration 444-1 allows the multimodal multiphase generator 132-1 to self-oscillate by using the loop 424. Thus, the configuration 444-1 enables the multimodal multiphase generator 132-1 to operate as a ring oscillator by matching the frequency and the phase of the signal 422-P to the frequency and the phase of the "same" signal at the node 430. By so doing, the self-oscillating-capable multimodal multiphase generator 132-1 can more quickly generate a fundamental or a subharmonic frequency, responsive to a configuration change, by closing the switch 408 or by closing the switch 412, respectively.

FIG. 4-2 illustrates an example architecture 400-2 of a complementary multimodal multiphase generator 132-2, which is another example architecture of the multimodal multiphase generator 132 of FIG. 3. The multimodal multiphase generator 132-2 operates similarly to the multimodal multiphase generator 132-1, with the addition of an AC current sink 454 (current sink 454). The current sink 454 is coupled between a switch 452 and a ground node 456. The switch 452 can enable flow of current between a summing node 450 and the current sink 454. The summing node 450 facilitates routing of output control signals 454-1, 454-2, . . . , 454-(P–1), and 454-P from the buffers 420-1, 420-2, . . . , 420-(P–1), and 420-P, respectively, to the current sink 454 and the ground node 456 responsive to the switch 452 being in a closed state.

In an example, the switches 408, 412, and 452 enable three configurations 440-2, 442-2, and 444-2 of the multimodal multiphase generator 132-2. The configurations 440-2, 442-2, and 444-2 enable the multimodal multiphase generator 132-2 to operate analogously to the configurations 440-1, 442-1, and 444-1 of FIG. 4-1. To operate in the fundamental mode of the configuration 440-2, the multimodal multiphase generator 132-2 closes the switch 408 and opens the switches 412 and 452. To operate in the subharmonic mode of the configuration 442-2, control circuitry opens the switch 408 and closes the switches 412 and 452. To operate as a ring oscillator with the configuration 444-2, control circuitry opens the switches 408, 412, and 452. Although the multiple output control signals 454-1 to 454-P are described for a complementary implementation that works with the multiple input control signals 414-1 to 414-P, the multiple output control signals 454-1 to 454-P can be used instead of the multiple input control signals 414-1 to 414-P in a single-ended architecture that is analogous to that of the multimodal multiphase generator 132-1 of FIG. 4-1.

FIG. 4-3 illustrates an example architecture 400-3 of a simplified differential multimodal multiphase generator 132-3. The multimodal multiphase generator 132-3 illustrates an example of the multimodal multiphase generator 132 of FIG. 3. In FIG. 4-3, two buffers of the multimodal multiphase generator 132-3 are shown, but more buffers may be included in a series-connected loop of such buffers. Specifically, inverters 420-1-1 and 420-1-2 can operate like the buffer 420-1, and inverters 420-2-1 and 420-2-2 can operate like the buffer 420-2 of FIGS. 4-1 and 4-2. The inverter 420-1-1 outputs a plus in-phase or in-phase-plus (I+) signal, and the inverter 420-1-2 outputs a minus in-phase or in-phase-minus (I−) signal. The inverter 420-2-1 outputs a plus quadrature or quadrature-plus (Q+) signal, and the inverter 420-2-2 outputs a minus quadrature or quadrature-minus (Q−) signal. These signals may also be referred to as phase components.

To generate the I−, I+, Q−, and Q+ signals or phase components, the multimodal multiphase generator 132-3 utilizes a plus clock or clock-plus (CLK+) signal and a minus clock or clock-minus (CLK−) signal for various operations. To operate in the fundamental mode, the multimodal multiphase generator 132-3 can utilize tristate inverters 402-P and 402-M, which operate analogously to the voltage source 402 of FIGS. 4-1 and 4-2, enable the injection of frequency using a voltage, and may supply the signals 308 and 310 (of FIG. 3). To operate in the subharmonic mode, the multimodal multiphase generator 132-3 utilizes supply voltages 410-1 and 410-2, combined with, e.g., p-type metal-oxide-semiconductor (PMOS) transistors 404-1 and 404-2 to operate analogously to the current source 404 of FIGS. 4-1 and 4-2. Thus, in the subharmonic mode, the supply voltages 410-1 and 410-2 and the PMOS transistors 404-1 and 404-2 enable the injection of a frequency using a current. To enable or disable the injection of the current, the multimodal multiphase generator 132-3 can utilize tristate inverters 412-1 and 412-2, combined with pulldown switches 412-3 and 412-4, which are coupled to ground nodes 418-1 and 418-2, respectively.

Similarly, ground nodes 456-1 and 456-2, combined with, e.g., n-type metal-oxide-semiconductor (NMOS) transistors 454-1 and 454-2, operate analogously to the current sink 454 of FIGS. 4-1 and 4-2. Thus, in the subharmonic mode, the ground nodes 456-1 and 456-2 and the NMOS transistors 454-1 and 454-2 enable the injection of current from a tail side of the multimodal multiphase generator 132-3. To enable or disable the injection of current from the tail side, the multimodal multiphase generator 132-3 utilizes pullup switches 452-3 and 452-4, which are coupled to supply voltages 458-1 and 458-2, respectively. Certain transistors depicted in the figures or described herein may be indicated to be field-effect transistors (FETs). Nonetheless, the illustrated and described transistors may be implemented using alternative transistor technologies, including junction FETs (JFETs), bipolar junction transistors (BJTs), and so forth. Further, transistors may be implemented as n-type, p-type, NPN, PNP, and so forth.

Further, to safeguard that the I− and I+ are maintained as differential signals, the multimodal multiphase generator 132-3 can include bussed tristate inverters 460-1, 460-2, . . . , and 460-S and tristate inverters 470-1, 470-2, . . . , and 470-S coupled between the lines or wires propagating the I− and the I+ signals, where S is an integer greater than one (1). Similarly, to safeguard that the Q− and Q+ are also maintained as differential signals, the multimodal multiphase generator 132-3 can include bussed tristate inverters 480-1, 480-2, . . . , and 480-S and tristate inverters 490-1, 490-2, . . . , and 490-S coupled between the lines or wires carrying the Q− and the Q+ signals.

The multimodal multiphase generator 132-3 can digitally control the bussed tristate inverters (e.g., 460-1, 470-1, 480-1, and 490-1) by turning them on or off. For example, in the fundamental mode, the multimodal multiphase generator 132-3 may reduce the coupling between the I−, I+, Q−, and Q+ differential signals or phase components by turning on fewer bussed tristate inverters. This can enable an improved injection from the voltage source that utilizes the tristate inverters 402-P and 402-M. In contrast, in the subharmonic mode, the multimodal multiphase generator 132-3 may increase the coupling between the I−, I+, Q−, and Q+ differential signals or phase components by turning on more bussed tristate inverters (e.g., 460-1, 470-1, 480-1, and 490-1).

Reconfigurable Frequency Multiplier

Figures 1, 5:
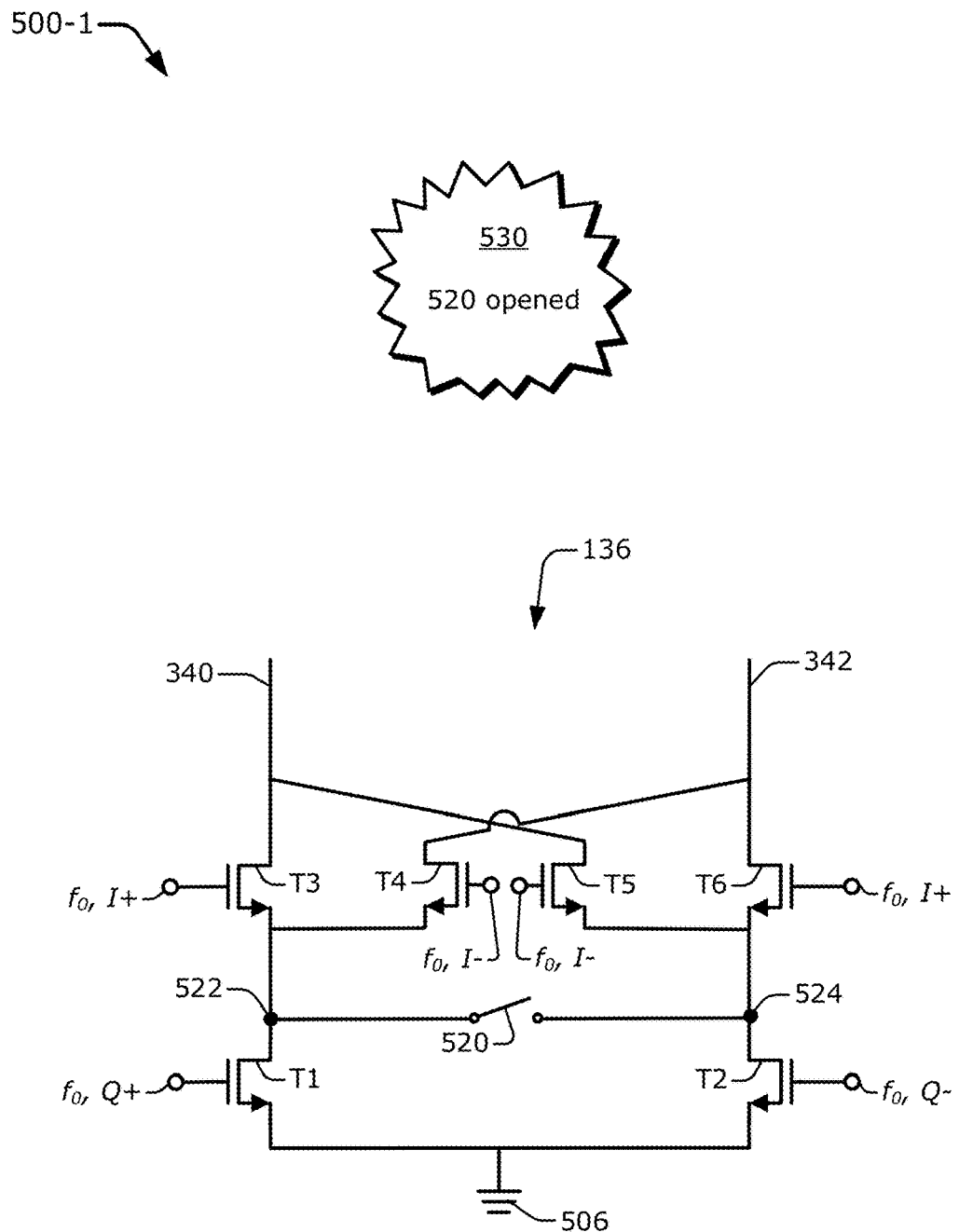
Figures 2, 5:
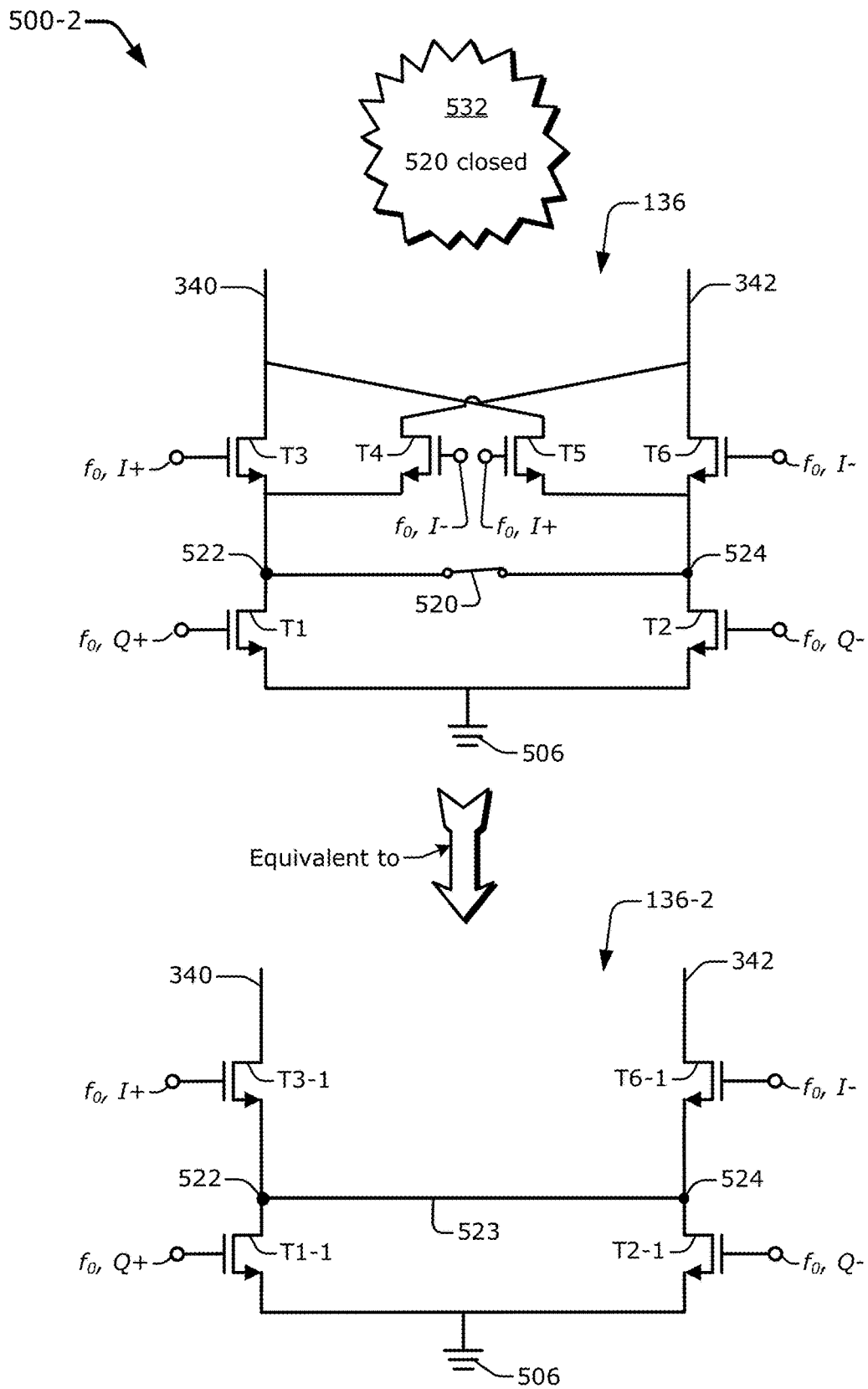

FIG. 5-1 illustrates an example architecture 500-1 of the reconfigurable multiplier 136 of FIG. 3. In this example, the reconfigurable frequency multiplier 136 may be implemented similarly to a "Gilbert cell." As shown, the reconfigurable frequency multiplier 136 can include circuitry of a double-balanced Gilbert cell including six transistors. The reconfigurable frequency multiplier 136 includes at least one plus portion and at least one minus portion. The transistors can include a first transistor, a second transistor, a third transistor, a fourth transistor, a fifth transistor, and a sixth transistor. More specifically, the six transistors include transistors T1 and T2 that form a first stage, or a transconductance stage, of the Gilbert cell. The six transistors also include transistors T3, T4, T5, and T6 that form a second stage, or a switching stage, of the Gilbert cell. The reconfigurable frequency multiplier 136 can also include a switch 520 that is coupled between the plus and minus portions and between the first and second stages. The reconfigurable frequency multiplier 136 can provide at least one output signal via the node 340 and/or the node 342 (e.g., as shown in FIG. 3).

In example implementations, the reconfigurable multiplier 136 includes six NMOS transistors T1, T2, T3, T4, T5, and T6. Each field-effect transistor (FET) includes three terminals: a gate terminal and at least one channel terminal. Two channel terminals can include a drain terminal and a source terminal. As is illustrated in FIG. 5-1, a drain of T3 is coupled to a node 340, and a source of T3 is coupled to a drain of T1. A drain of T4 is coupled to a node 342, and a source of T4 is coupled to the drain of T1 and the source of T3. The source of T3, the source of T4, and the drain of T1 are coupled together at a node 522. A source of T1 is coupled to a ground node 506. Similarly, a drain of T6 is coupled to the node 342, and a source of T6 is coupled to a drain of T2. A drain of T5 is coupled to the node 340, and a source of T5 is coupled to the drain of T2 and the source of T6. The source of T6, the source of T5, and the drain of T2 are coupled together at a node 524. A source of T2 is coupled to the ground node 506. A switch 520 is coupled between the node 522 and the node 524.

In a first multiply mode, which is denoted as a configuration 530, the reconfigurable frequency multiplier 136 can multiply frequencies of input signals by a factor of two. Thus, the reconfigurable frequency multiplier 136 can operate as a multiply-by-two frequency multiplier. Throughout this disclosure, terms "first multiply mode," "multiply-by-two," and/or "configuration 530" can be used interchangeably relative to the reconfigurable frequency multiplier 136 depending on the context, linguistic choice, and/or other factors. With the configuration 530, the switch 520 is in an open state, and the gate terminals of T1, T2, T3, T4, T5, and T6 are provided phase components Q+, Q−, I+, I−, I−, and I+ (e.g., from the multimodal multiphase generator 132-3 of FIG. 4-3), respectively. If the input signals coupled to the gates of T1 to T6 have a frequency $f_o$, the configuration 530 of the reconfigurable frequency multiplier 136 generates output signals (or a differential signal) with frequency $2f_o$ at the nodes 340 and 342.

FIG. 5-2 illustrates example architectures 500-2 of other configurations of the reconfigurable frequency multiplier 136. In a second multiply mode, which is denoted as a configuration 532, the reconfigurable multiplier 136 can multiply frequencies of input signals by a factor of three (3). Thus, the reconfigurable multiplier 136 can operate as a multiply-by-three frequency multiplier. Throughout this disclosure, terms "second multiply mode," "multiply-by-three," and/or "configuration 532" can be used interchangeably relative to the reconfigurable frequency multiplier 136 depending on the context, linguistic choice, and/or other factors. Specifically, the configuration 532 can have the switch 520 in the closed state. Further for the configuration 532, the input signals applied to the gate terminals of T1, T2, T3, T4, T5, and T6 can correspond to the multiphase signals Q+, Q−, I+, I−, I+, and I−, respectively, by using the switch matrix circuit 134, as is further described below with reference to FIG. 6. Thus, if the input signals to the gates of T1 to T6 have a frequency $f_o$, with the configuration 532, the reconfigurable frequency multiplier 136 generates output signals with frequency $3f_o$ at the nodes 340 and 342. As shown in FIG. 3, these signals can be tuned with the frequency tuning circuit 138 as part of the coupling of the oscillating frequency as at least one of the signals 272 (of FIG. 2) to another component, such as a frequency converter.

In more detail, by closing the switch 520 and by applying a same signal to the gates of T4 and T6 and a same signal to the gates of T3 and T5, the reconfigurable frequency multiplier 136 can operate equivalently to a frequency tripler core, as is illustrated in a reconfigurable multiplier 136-2 of FIG. 5-2. The frequency tripler core mixes the fundamental with the second harmonic from the push-push doubler responsive to the switch 520 being in a closed state. In the configuration 532, the respective sources, drains, and gates of T3 and T5 are each at a same voltage potential. Similarly, the respective sources, drains, and gates of T4 and T6 are also each at a same voltage potential. Consequently, the reconfigurable frequency multiplier 136 depicted in the top half of FIG. 5-2 operates similarly to the triple frequency multiplier 136-2 in the lower half of FIG. 5-2. The triple frequency multiplier 136-2 effectively reduces to utilizing four (instead of six) NMOS transistors T1-1, T2-1, T3-1, and T6-1. In a representation of the triple frequency multiplier 136-2, a drain of T3-1 is coupled to the node 340, and a source of T3-1 is coupled to a drain of T1-1. A source of T1-1 is coupled to the ground node 506. Similarly, a drain of T6-1 is coupled to the node 342, and a source of T6-1 is coupled to a drain of T2-1. A source of T2-1 is coupled to the ground node 506. Accordingly, the drains of T1-1 and T2-1 and the sources of T3-1 and T6-1 are coupled to a common node 523.

Switch Matrix Circuit

Figure 6:
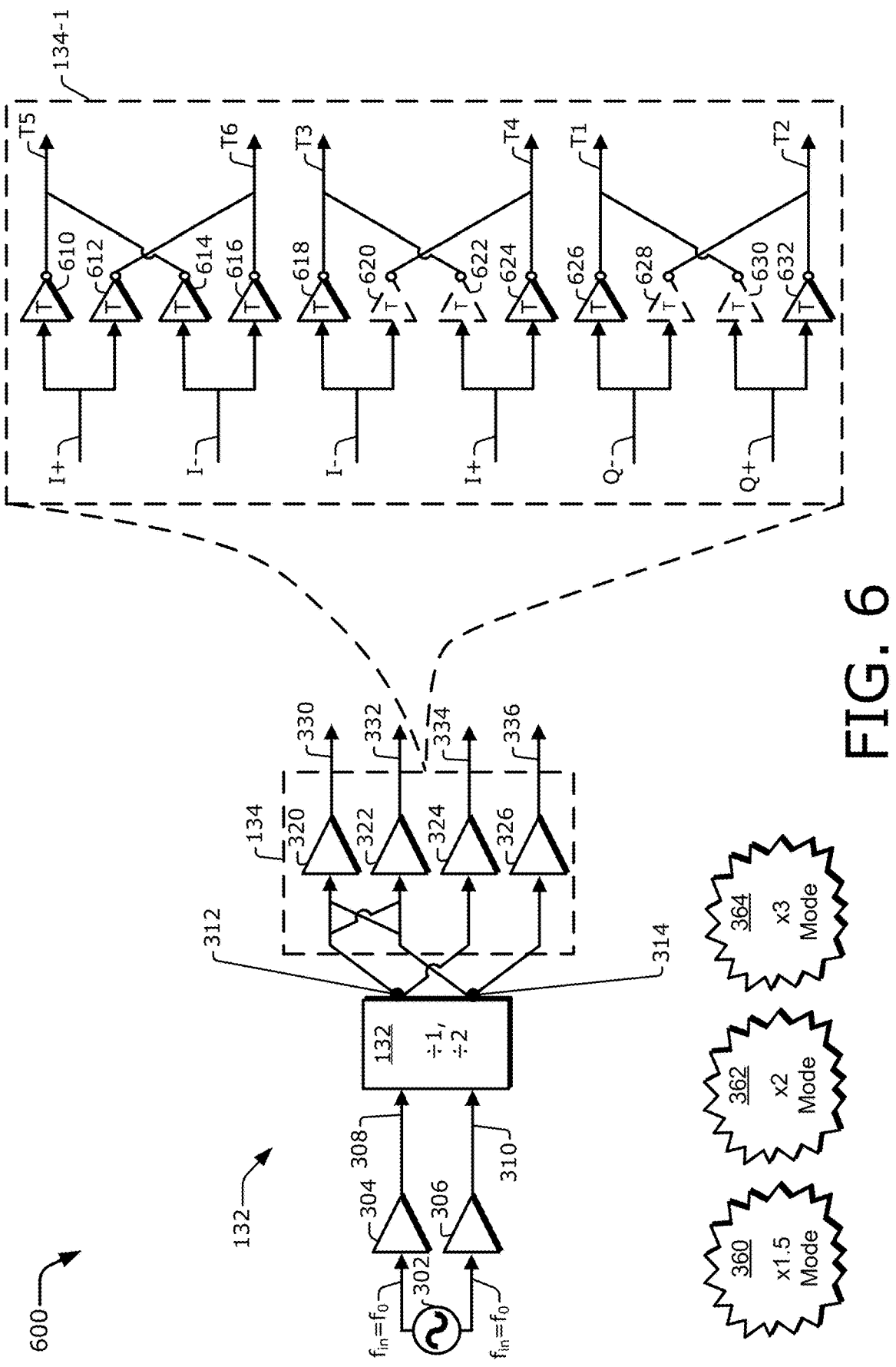
FIG. 6 illustrates an example implementation of the switch matrix circuit in conjunction with example operational modes for a multimode frequency multiplier.

FIG. 6 illustrates an example implementation 600 detailing example operational modes (e.g., the ×1.5 mode 360, the ×2 mode 362, or the ×3 mode 364) of the multimode frequency multiplier 130 utilizing the switch matrix circuit 134. FIG. 6 is described in the context of FIGS. 1 to 5-2, including the multimodal multiphase generator 132, the reconfigurable frequency multiplier 136 (and 136-2), and Equations 1 to 6. As such, in FIG. 6, the VCO 302, the buffers 304 and 306, the signals 308 and 310, the multimodal multiphase generator 132, and the signals 312 and 314 can operate as described above.

The multimodal multiphase generator 132 generates the signals 312 and 314, which may form quadrature signals. For example, as described with reference to FIGS. 4-1 to 4-3, in the fundamental mode (e.g., 440-1 and 440-2), the multimodal multiphase generator 132 can generate divide-by-one (÷1) I+, I−, Q+, and Q− multiphase signal components. On the other hand, in the subharmonic mode (e.g., 442-1 and 442-2), the multimodal multiphase generator 132 can generate divide-by-two (÷2) I+, I−, Q+, and Q− multiphase signals. In addition, as depicted in FIGS. 5-1 and 5-2, the reconfigurable frequency multiplier 136 may operate as a multiply-by-two (e.g., the configuration 530) or as a multiply-by-three (e.g., the configuration 532) reconfigurable multiplier by opening or closing the switch 520 and adjusting some of the input signals coupled to the gates of the transistors T1 to T6.

Whether the reconfigurable frequency multiplier 136 operates in the configuration 530 or 532, the inputs to the gate terminals of the transistors T1 to T4 may be the same. To switch between the configurations 530 and 532, however, the inputs to the gates of the transistors T5 and T6 are swapped. To swap the inputs to the gate terminals of the transistors T5 and T6, the multimode frequency multiplier 130 utilizes the switch matrix circuit 134. Given that buffers may perform better than switches at high frequencies, the switch matrix circuit 134 may utilize the buffers 320, 322, 324, and 326. The switch matrix circuit 134, however, may utilize switches (not illustrated in FIG. 6) instead of, or in addition to, buffers.

An example schematic circuit 134-1 of the switch matrix circuit 134 includes tristate inverters 610, 612, 614, 616, 618, 620, 622, 624, 626, 628, 630, and 632. Inputs to the tristate inverters 610, 612, 618, and 620 include in-phase-plus signals (e.g., ÷1_I+ or ÷2_I+). Inputs to the tristate inverters 614, 616, 622, and 624 include in-phase-minus signals (e.g., ÷1_I− or ÷2_I−). Inputs to the tristate inverters 626 and 628 include quadrature-plus signals (e.g., ÷1_Q+ or ÷2_Q+). Inputs to the tristate inverters 630 and 632 include quadrature-plus signals (e.g., ÷1_Q− or ÷2_Q−). In operation, a tristate inverter inverts a signal, for example, from I+ to I−, from I− to I+, from Q+ to Q−, or from Q− to Q+.

An output from the inverter 610 or an output from the inverter 614 can be coupled to the gate terminal of the transistor T5. An output from the inverter 612 or an output from the inverter 616 can be coupled to the gate terminal of the transistor T6. Thus, the switch matrix circuit 134 enables the swapping of the inputs to the gates of the transistors T5 and T6, depending on a selected configuration of the reconfigurable frequency multiplier 136 for instance. On the other hand, the example schematic circuit 134-1 of the switch matrix circuit 134 disables the tristate inverters 620, 622, 628, and 630. As a result, the input signals for the gate terminals of the transistors T1 to T4 do not change based on an open or closed state of the switch 520 or the configuration 530 or 532. Alternatively, the switch matrix circuit 134 can omit the tristate inverters 620, 622, 628, and 630 instead of including and then disabling them.

Table 1 below illustrates how the switch matrix circuit 134 can use the signals 312 and 314 to generate signals for the gate terminals of the transistors T1 to T6 of the reconfigurable frequency multiplier 136. Depending on the position of the switch 520 of the reconfigurable multiplier 136 (e.g., opened in FIG. 5-1 or closed in FIG. 5-2), the multimode frequency multiplier 130 may operate in the ×1.5 mode 360, the ×2 mode 362, or the ×3 mode 364, as is indicated by Equations 4 to 6.

TABLE 1

Signal Phase Components Provided to Switch Matrix Circuit 134 from Multimodal Multiphase Generator 132

| Operation of 130 | x2 Mode 362 | x3 Mode 364 | x1.5 Mode 360 |
|---|---|---|---|
| Switch 520 | Open | Closed | Closed |
| Output of 132: for the gate of T1 | ÷1_Q− | ÷1_Q− | ÷2_Q− |
| Output of 132: for the gate of T2 | ÷1_Q+ | ÷1_Q+ | ÷2_Q+ |
| Output of 132: for the gate of T3 | ÷1_I− | ÷1_I− | ÷2_I− |
| Output of 132: for the gate of T4 | ÷1_I+ | ÷1_I+ | ÷2_I+ |
| Output of 132: for the gate of T5 | ÷1_I+ | ÷1_I− | ÷2_I− |
| Output of 132: for the gate of T6 | ÷1_I− | ÷1_I+ | ÷2_I+ |

Table 1 indicates an example mapping of signal phase components I+, I−, Q+, and Q−. These signal phase components are provided to an input of the switch matrix circuit 134 from an output of the multimodal multiphase generator 132. As indicated in the first row, Table 1 is directed to three modes across the columns from left to right: the ×2 mode 362, the ×3 mode 364, and the ×1.5 mode 360. The second row indicates whether the switch 520 is in an open state or a closed state to achieve the corresponding mode. As indicated in the left-most column, the remaining six rows indicate where different outputs of the multimodal multiphase generator 132 are to be routed to, each of which is a gate terminal of at least one of the transistors T1 to T6. Consider the output of the multimodal multiphase generator 132 that is being routed to the gate terminal of the transistor T3 for the ×2 mode 362. This corresponds to the indicated ÷1_I− (e.g., the I− phase component signal with the multimodal multiphase generator 132 operating in the ÷1 (fundamental) mode). As shown on the right at the example schematic circuit 134-1 of the switch matrix circuit 134, the I− phase component signal is routed through the tristate inverter 618 to the transistor T3. The tristate inverter 618 inverts the I− phase component to produce the I+ phase component signal for the gate terminal of the transistor T3, as depicted in FIG. 5-1 for the configuration 530.

As is illustrated in Table 1 and indicated in Equation 5 above, the multimode frequency multiplier 130 can operate in the ×2 mode 362 by using the fundamental mode (e.g., with the configuration 440-1) of the multimodal multiphase generator 132 and the multiply-by-two configuration (e.g., with the configuration 530) of the reconfigurable frequency multiplier 136. Secondly, as is illustrated in Table 1 and indicated in Equation 6, the multimode frequency multiplier 130 can operate in the ×3 mode 364 by using the fundamental mode (e.g., with configuration 440-1) of the multimodal multiphase generator 132 and the multiply-by-three configuration (e.g., the configuration 532) of the reconfigurable frequency multiplier 136.

Thirdly, as is illustrated in Table 1 and indicated in Equation 4, the multimode frequency multiplier 130 can operate in the ×1.5 mode 360 by using the subharmonic mode (e.g., the configuration 440-2) of the multimodal multiphase generator 132 and the multiply-by-three configuration (e.g., the configuration 532) of the reconfigurable frequency multiplier 136. A wireless interface device 120 can therefore operate at a fundamental frequency of an oscillating signal, at 1.5× the fundamental frequency, at 2× the fundamental frequency, or at 3× the fundamental frequency based on the oscillating signal that is produced by one VCO. Deriving such an expanded frequency range from the output of a single VCO can lower costs, reduce a size of a wireless interface device, or decrease power consumption.

Frequency Tuning Circuit

FIG. 7 illustrates an example architecture 700 of the frequency tuning circuit 138, which can facilitate operation of the multimode frequency multiplier 130 in multiple narrow bands across a wide-range of frequencies. The frequency tuning circuit 138 can be powered by a supply voltage 702 (e.g., $V_{DD}$=0.95V) and coupled to the reconfigurable frequency multiplier 136 using the nodes 340 and 342. As illustrated, an inductor 704 (L1 704) is coupled between the supply voltage 702 and the node 340. Similarly, an inductor 706 (L2 706) is coupled between the supply voltage 702 and the node 342. In addition, the frequency tuning circuit 138 can include an inductive tuning circuit 710 (inductive tuning 710), a capacitive tuning circuit 720 (capacitive tuning 720), or a transconductance booster circuit 730 ($g_m$ booster 730). The frequency tuning circuit 138 can include any one or more of these components 710, 720, or 730 or can omit all of such components.

In example implementations, the inductive tuning circuit 710 includes at least two inductors and at least one switch. As is illustrated in FIG. 7, the inductive tuning circuit 710 includes an inductor 712-1 (L1 712-1), a switch 716-1, and an inductor 714-1 (L2 714-1), which are coupled together in series between the node 340 and the node 342. The switch 716-1 is coupled between L1 712-1 and L2 714-1 and enables an increase or decrease in an overall inductance of the frequency tuning circuit 138. Similarly, the capacitive tuning circuit 720 includes at least two capacitors and at least one switch. As is illustrated in FIG. 7, the capacitive tuning circuit 720 includes capacitors C1 722-1, C1 722-2, . . . , C1 722-Q; switches 726-1, 726-2, . . . , 726-Q; and capacitors C2 724-1, C2 724-2, . . . , C2 724-Q, where Q is an integer greater or equal to one (1). The switches 726-1, 726-2, . . . , 726-Q enable an increase or a decrease of a total capacitance $C_T$ between the nodes 340 and 342, as is indicated by Equations 7 and 8:

a minimum $C_T$ when the switches 726-1, 726-2, . . . , 726-Q are open:

$$C_T = 0 \qquad \text{Equation 7;}$$

a maximum $C_T$ when the switches 726-1, 726-2, ..., 726-Q are closed:

$$C_T = \left(\frac{1}{C1\_722-1} + \frac{1}{C2\_724-1}\right) + \left(\frac{1}{C1\_722-2} + \frac{1}{C2\_724-2}\right) + \cdots + \left(\frac{1}{C1\_722-Q} + \frac{1}{C2\_724-Q}\right). \quad \text{Equation 8}$$

As is illustrated in FIG. 7, the $g_m$ booster 730 includes a differential, cross-coupled mixer core and a variable current sink 736, which is coupled to a ground node 738. The differential mixer core of the $g_m$ booster 730 utilizes NMOS transistors T7 and T8. A drain of the transistor T7 is coupled to the node 340, a gate of the transistor T7 is coupled to the node 342, and a source of the transistor T7 is coupled to the variable current sink 736. Similarly, a drain of the transistor T8 is coupled to the node 342, a gate of the transistor T8 is coupled to the node 340, and a source of the transistor T8 is coupled to the variable current sink 736.

As described in FIG. 3, the output frequency of the output signal $f_{out}$ at the nodes 340 and 342 can cover a wide frequency band or range. To achieve a particular frequency band within the wide frequency range, the frequency tuning circuit 138 can change the total inductance, the total capacitance $C_T$, and/or a total transconductance between the node 340 and the node 342 by using the switches 716-1, 726-1, 726-2, ..., 726-Q and/or the variable current sink 736. Therefore, the frequency tuning circuit 138 can facilitate the multimode frequency multiplier 130 covering a wide tuning range of frequencies and generating a sharp "peak" using a narrow-band load to focus on a particular frequency band. Nonetheless, the frequency tuning circuit 138 can be omitted from certain implementations. In some cases, the output of the reconfigurable frequency multiplier 136 can provide an output that meets targeted parameters without the frequency tuning circuit 138. In other cases, the nodes 340 and 342 may be coupled directly to the inductor 704 (L1 704) and the inductor 706 (L2 706) or may be coupled directly to the supply voltage 702. Alternatively, the frequency tuning circuit 138, and any of the components 710, 720, or 730, may include unswitched elements, such as inductors and/or capacitors without a switch.

Example Methods

Figures 1, 8:
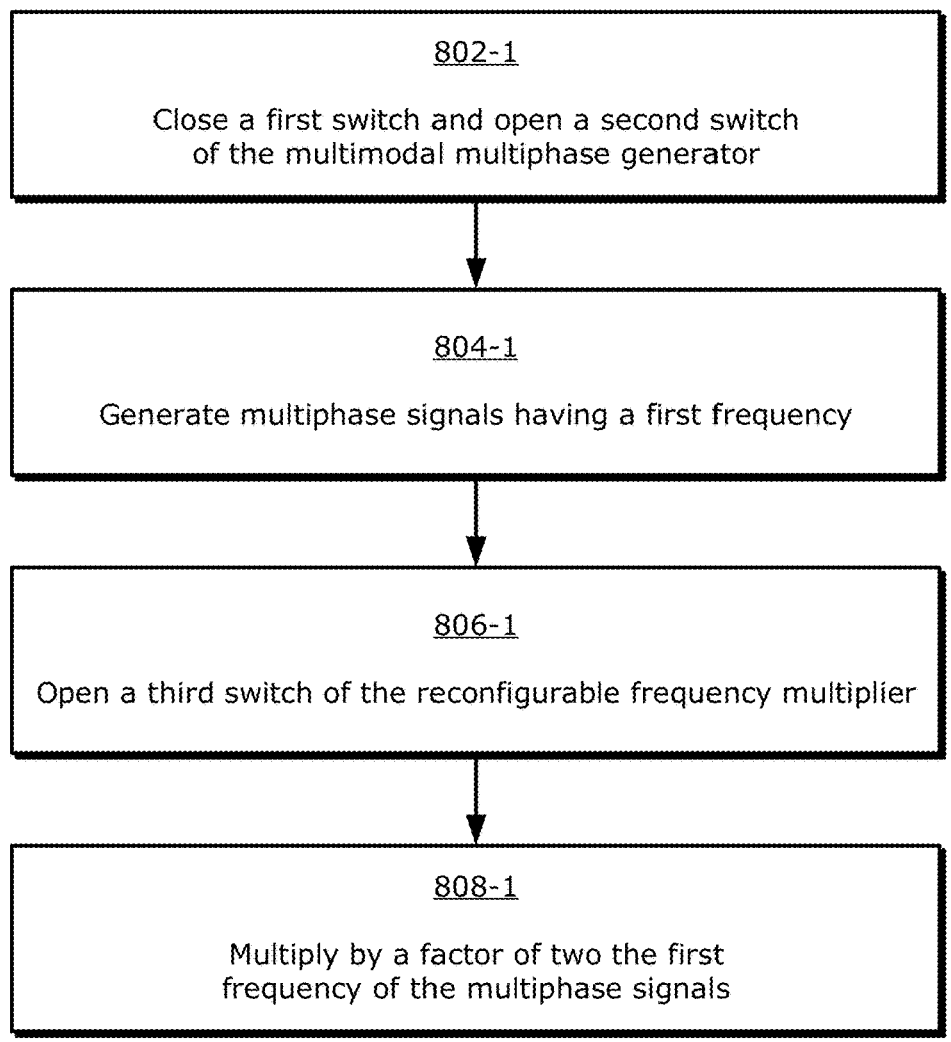
Figures 2, 8:
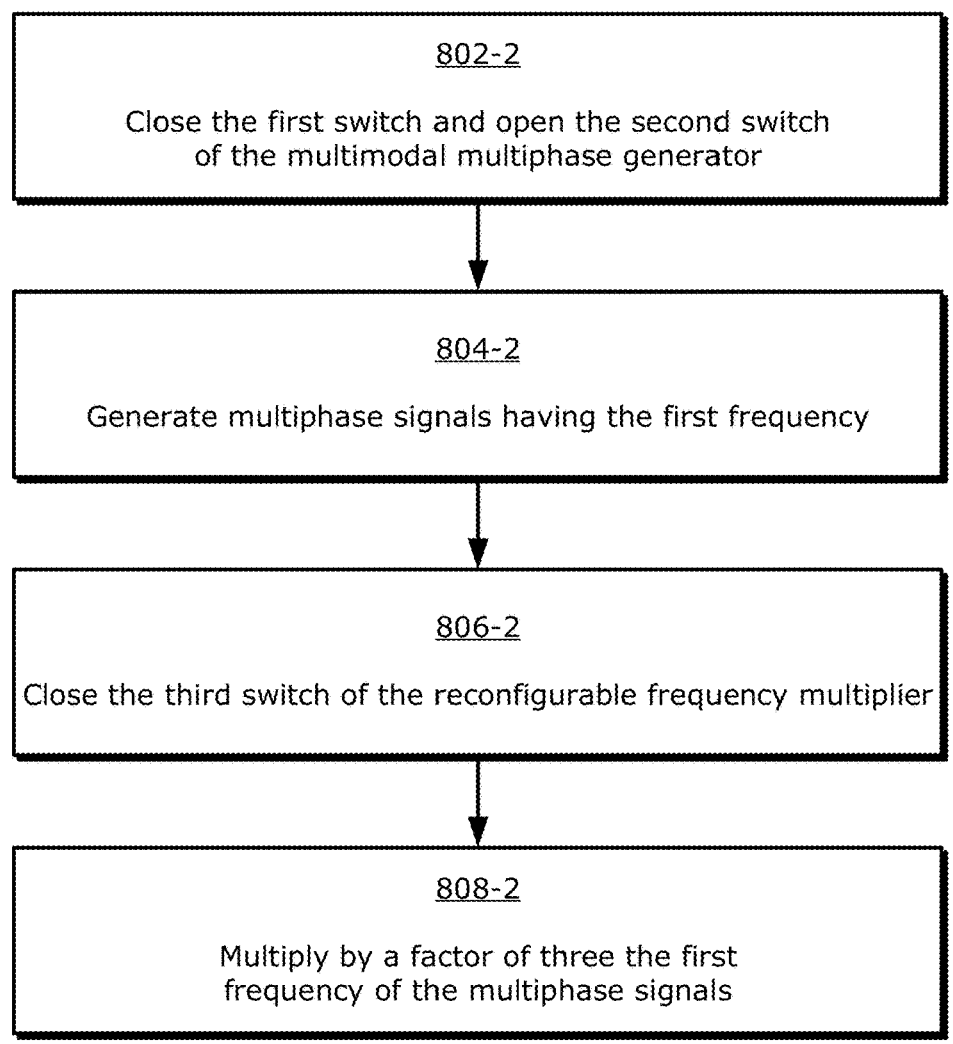
Figures 3, 8:
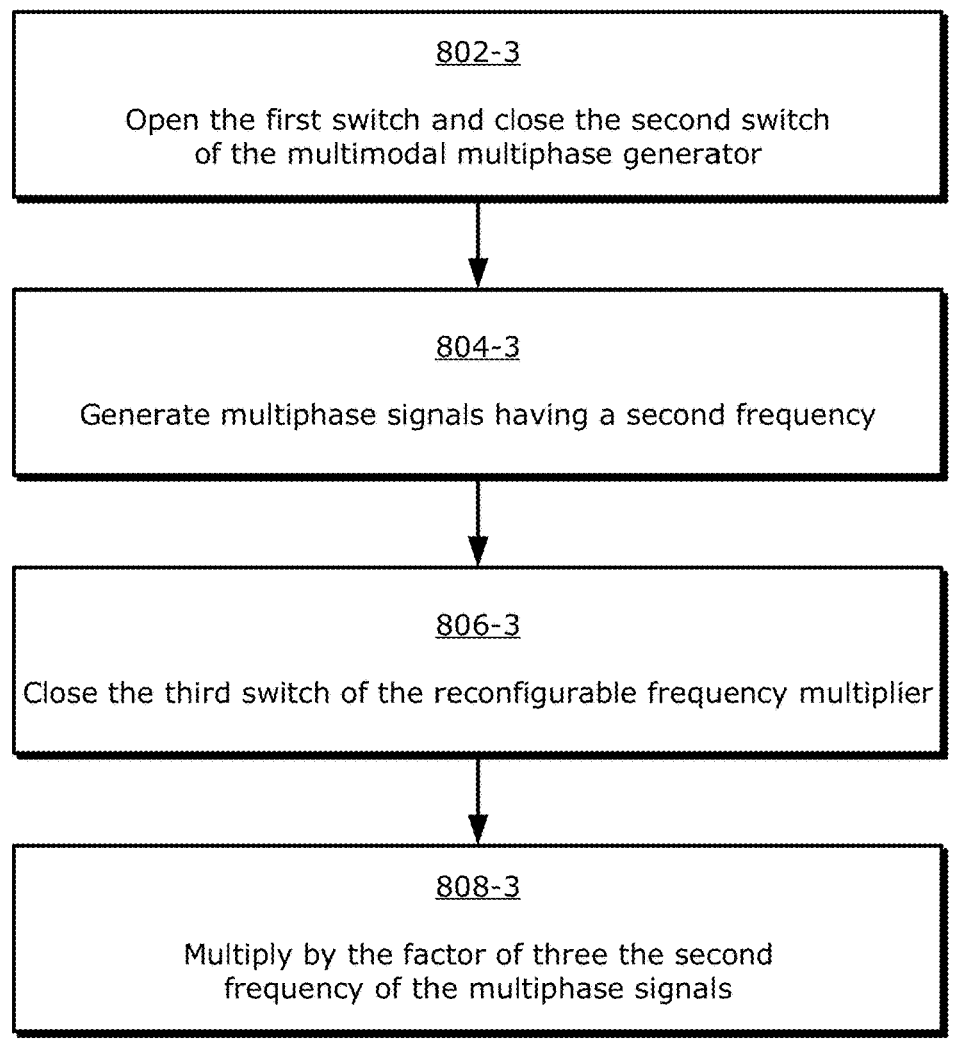

FIGS. 8-1 to 8-3 and 9 illustrate respective flow diagrams for respective processes. Each process is described in the form of a set of blocks that specify operations that can be performed. However, operations are not necessarily limited to the order shown in the figures or described herein, for the operations may be implemented in alternative orders or in fully or partially overlapping manners. Also, more, fewer, and/or different operations may be implemented to perform the described processes or alternative processes. These FIGS. 8-1 to 8-3 and 9 are described with reference also to FIGS. 1 to 7. Thus, the example aspects described above for the multimode frequency multiplier 130, as well as those of the multimodal multiphase generator 132, the switch matrix circuit 134, the reconfigurable frequency multiplier 136, and so forth, can be used to implement the described processes. In the context of FIGS. 8-1 to 8-3, assume the VCO operates at fundamental frequency $f_0$.

FIG. 8-1 illustrates an example process 800-1 that can be performed by the electronic device 102 using the multimode frequency multiplier 130 to generate multiphase signals (e.g., 272-1, 272-2, 272-3, and 272-4) having a frequency two times (2×) a frequency of the VCO 302. At block 802-1, the multimode frequency multiplier 130 closes a first switch (e.g., the switch 408) and opens a second switch (e.g., the switch 412) of the multimodal multiphase generator 132. As described above, the multimodal multiphase generator 132 can selectively generate multiphase signals (e.g., I+, I−, Q+, and Q) having one of at least two different frequencies (e.g., $f_0$ or $$\frac{f_0}{2}\bigg).$$

At block 804-1, as the multimode frequency multiplier 130 closes the first switch (e.g., the switch 408) and opens the second switch (e.g., the switch 412), the multimodal multiphase generator 132 generates the multiphase signals having a first frequency $f_0$ of the at least two frequencies (e.g., $f_0$ or $$\frac{f_0}{2}\bigg).$$

In one aspect, the operations of the block 804-1 correspond to the configurations 440 of any of FIGS. 4-1 to 4-3.

At block 806-1, the multimode frequency multiplier 130 opens a third switch (e.g., the switch 520) of the reconfigurable frequency multiplier 136. As described above, the reconfigurable multiplier 136 may selectively multiply the one of the at least two different frequencies of the multiphase signals by at least two different factors (e.g., by a factor of two or by a factor of three). In the context of FIG. 8-1, the reconfigurable frequency multiplier 136 multiplies the frequency $f_0$ of the multiphase signals by two (2). In one aspect, the block 806-1 corresponds to the configurations 530 of FIG. 5-1. Thus, at block 808-1, responsive to the multimode frequency multiplier 130 opening the third switch (e.g., the switch 520) of the reconfigurable frequency multiplier 136, the reconfigurable multiplier 136 multiplies the multiphase signals having the fundamental frequency $f_0$ by a factor of two. In one aspect, the blocks of 802-1 to 808-1 describe an example operation of a multiply-by-two mode 362 of Equation 5.

FIG. 8-2 illustrates an example process 800-2 that can be performed by the electronic device 102 using the multimode frequency multiplier 130 to generate multiphase signals (e.g., 272-1, 272-2, 272-3, and 272-4) having a frequency three times (3×) the frequency of the VCO 302. At block 802-2, the multimode frequency multiplier 130 closes the first switch (e.g., the switch 408) and opens the second switch (e.g., the switch 412) of the multimodal multiphase generator 132, which is similar to the operations of the block 802-1 of FIG. 8-1. At block 804-2, the multimodal multiphase generator 132 generates the multiphase signals having the first frequency (e.g., the fundamental frequency $f_0$) of the at least two frequencies (e.g., $f_0$ or $$\frac{f_0}{2}\bigg),$$

which is also similar to the operations of the block 804-1 of FIG. 8-1.

At block 806-2, the multimode frequency multiplier 130 closes the third switch (e.g., the switch 520) of the reconfigurable frequency multiplier 136. At stage 808-2, the reconfigurable frequency multiplier 136 multiplies the multiphase signals having the fundamental frequency $f_0$ by a factor of three. In one aspect, the blocks 802-2 to 808-2 describe an example operation of a multiply-by-three mode 364 of Equation 6.

FIG. 8-3 illustrates an example process 800-3 that can be performed by the electronic device 102 using the multimode frequency multiplier 130 to generate multiphase signals (e.g., 272-1, 272-2, 272-3, and 272-4) having a frequency one and a half times (1.5×) the frequency of the VCO 302. At block 802-3, the multimode frequency multiplier 130 opens the first switch (e.g., the switch 408) and closes the second switch (e.g., the switch 412) of the multimodal multiphase generator 132. At block 804-3, the multimodal multiphase generator 132 generates the multiphase signals having a second frequency (e.g., a subharmonic frequency like $$\frac{f_0}{2})$$

of the at least two frequencies (e.g., $f_0$ or $$\frac{f_0}{2}).$$

In one aspect, the operations of the block 804-3 correspond to the configurations 442 of any of FIGS. 4-1 to 4-3.

At block 806-3, the multimode frequency multiplier 130 closes the third switch (e.g., the switch 520) of the reconfigurable frequency multiplier 136. This can correspond to the configuration 532 of FIG. 5-2. At block 808-3, the reconfigurable frequency multiplier 136 multiplies the multiphase signals having the subharmonic frequency $$\frac{f_0}{2}$$

by a factor of three. In one aspect, blocks 802-3 to 808-3 describe an example operation of a multiply-by-one-and-a-half mode 360 of Equation 4.

Figure 9:
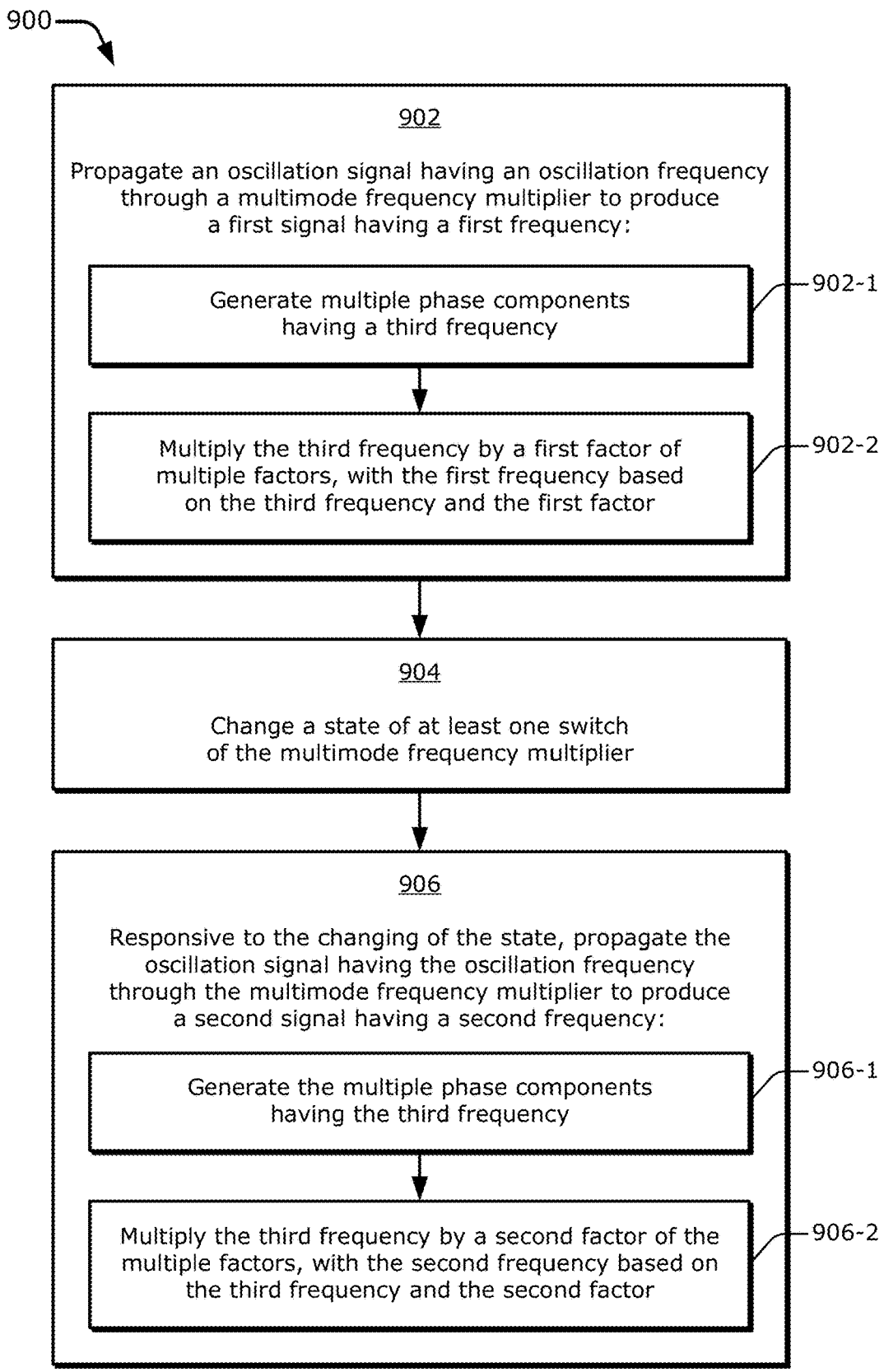
FIG. 9 is a flow diagram illustrating an example process for operating a multimode frequency multiplier to process signals for wireless communication.

FIG. 9 is a flow diagram illustrating an example process 900 for operating a multimode frequency multiplier 130. The process 900 is described in the form of a set of blocks 902-906 that specify operations that can be performed. The operations represented by the illustrated blocks of the process 900 may be performed by a multimode frequency multiplier 130 or a portion thereof, such as a multiphase generator 132 or a reconfigurable multiplier 136. The multimode frequency multiplier 130 can generate a frequency from an oscillation signal having an oscillation frequency.

At block 902, an oscillation signal having an oscillation frequency is propagated through a multimode frequency multiplier to produce a first signal having a first frequency. For example, a wireless interface device 120 can propagate a signal 308 or a signal 310 (including either or both) having an oscillation frequency $f_0$ through the multimode frequency multiplier 130 to produce an output signal at a node 340 or a node 342 (including at either or both for a plus output and a minus output). The signal 308 or the signal 310 may be produced, for instance, at least partly by a VCO 302. Further, these nodes 340 and 342 may provide an output signal with a plus portion and a minus portion having an output frequency $f_{out}$ of $1.5f_0$, $2f_0$, or $3f_0$. The operations of block 902 can include those of blocks 902-1 and 902-2.

At block 902-1, multiple phase components having a third frequency are generated. For example, the multiphase generator 132 can generate multiple phase component signals 312 or 314 (including either or both) having a respective frequency $f_{312}$ or $f_{314}$, as per equation 1, 2, or 3. If one or more switches are included in the multiphase generator 132, the multiple phase component signals may be produced by a multimodal multiphase generator 132 in which the frequency is selectable, as is described below.

At block 902-2, the third frequency is multiplied by a first factor of multiple factors, with the first frequency based on the third frequency and the first factor. For example, the reconfigurable frequency multiplier 136 can multiply the frequency $f_{312}$ or $f_{314}$ by a factor (e.g., a value) of multiple factors (e.g., a positive integer selected from multiple frequency values). The factor may be established at least partially responsive to a state of one or more switches of the reconfigurable frequency multiplier 136, the switch matrix circuit 134, a combination thereof, and so forth.

At block 904, a state of at least one switch of the multimode frequency multiplier is changed. For example, control circuitry (e.g., of a communication processor 122) can change a state of at least one switch of the multimode frequency multiplier 130. In some cases, the control circuitry may change a state (e.g., from an open state to a closed state, or vice versa) of a switch 520 to reconfigure the reconfigurable frequency multiplier 136 and thereby adjust a factor at which the reconfigurable multiplier 136 multiplies a frequency produced by the multiphase generator 132.

At block 906, responsive to the changing of the state, the oscillation signal having the oscillation frequency is propagated through the multimode frequency multiplier to produce a second signal having a second frequency. For example, after the state of the at least one switch is changed, the wireless interface device 120 can propagate the oscillation signal from the VCO 302 through the multimode frequency multiplier 130 to produce an output signal having a different output frequency $f_{out}$ that is selected from $1.5f_0$, $2f_0$, or $3f_0$. The operations of block 906 can include those of blocks 906-1 and 906-2.

At block 906-1, the multiple phase components having the third frequency are generated. For example, the multiphase generator 132 can generate the multiple phase component signals 312 or 314 having the respective frequency $f_{312}$ or $f_{314}$, as per equation 1, 2, or 3. Generally, the respective frequency $f_{312}$ or $f_{314}$ may or may not be different with different modes of the multimode frequency multiplier 130. If the multiphase generator 132 itself has a single mode, the frequency produced by the multiphase generator 132 can remain the same (assuming the input oscillation frequency is constant). On the other hand, if the multiphase generator 132 comprises a multimodal multiphase generator 132 with different configurations 440 and 442, the multimodal multiphase generator 132 may produce a signal with a different frequency, even if the input oscillation frequency is unchanged. This aspect is described further below.

At block 906-2, the third frequency is multiplied by a second factor of the multiple factors, with the second frequency based on the third frequency and the second factor. For example, the reconfigurable frequency multiplier 136 can multiply the frequency $f_{312}$ or $f_{314}$ by a different factor (e.g., a different value) of multiple factors (e.g., a different positive integer). To do so, the reconfigurable frequency multiplier 136 can be reconfigured (e.g., a configuration 530 or 532) responsive to a state change of at least one switch, such as the switch 520. The state change may, for instance, transform the reconfigurable frequency multiplier 136 from functioning as a frequency doubler circuit to functioning as a frequency tripler circuit.

In some implementations, the multimode frequency multiplier 130 may perform additional or alternative example operations. For example, the wireless interface device 120 can change a state of at least one other switch of the multimode frequency multiplier 130. At least one of the switches 408, 412, or 452 can be opened or closed, for instance. Responsive to the changing of the state of the at least one other switch, the wireless interface device 120 may propagate the oscillation signal having the oscillation frequency through the multimode frequency multiplier 130 to produce a third signal having a fourth frequency.

To do so, the multimodal multiphase generator 132 can generate the multiple phase components having a fifth frequency, such as by generating multiple phase components having a subharmonic frequency of the oscillation frequency of the input signal instead of components having the oscillation frequency (or vice versa). To adjust the frequency of the generated multiphase components, the multimodal multiphase generator 132 may swap between "indirectly" injecting the oscillation frequency into a plus signal pathway or a minus signal pathway at a first buffer using at least one current via a first signal path to "directly" injecting the oscillation frequency into a plus signal pathway or a minus signal pathway at a second buffer using at least one voltage via a second signal path. The reconfigurable frequency multiplier 136 can multiply the fifth frequency by the first factor or the second factor (e.g., by two (2) or by three (3)) of the multiple factors. Thus, the fourth frequency produced by the multimode frequency multiplier 130 may be based on the fifth frequency from the multimodal multiphase generator 132 and the first factor or the second factor of the reconfigurable frequency multiplier 136.

In this section, some example aspects describing certain configurations pursuant to the concepts described herein are included.

Example 1: An apparatus for generating a frequency, the apparatus comprising:
 a multimode frequency multiplier comprising:
  a multiphase generator configured to produce a first signal comprising multiple phase components and having a first frequency; and
  a reconfigurable frequency multiplier coupled in series with the multiphase generator, the reconfigurable frequency multiplier configured to produce a second signal based on the first signal and having a second frequency that is a multiple of the first frequency.

Example 2: The apparatus as recited in example 1, wherein:
 the multiphase generator comprises a multimodal multiphase generator configured to selectively adjust the first frequency.

Example 3: The apparatus as recited in example 2 or example 1, wherein the multimodal multiphase generator is configured to:
 produce the first signal having the first frequency based on an oscillating signal having a fundamental frequency; and
 adjust the first frequency between two or more frequency values.

Example 4: The apparatus as recited in example 3 or any of the preceding examples, wherein the two or more frequency values comprise approximately the fundamental frequency and approximately a subharmonic frequency of the fundamental frequency.

Example 5: The apparatus as recited in example 4 or any of the preceding examples, wherein the subharmonic frequency comprises approximately a value of the fundamental frequency divided by an integer that is greater than one.

Example 6: The apparatus as recited in example 1 or any of the preceding examples, wherein the multiphase generator comprises:
 multiple buffers coupled together in series,
 wherein a buffer of the multiple buffers is coupled to a signal path corresponding to an oscillation signal having an oscillation frequency.

Example 7: The apparatus as recited in example 6 or any of the preceding examples, wherein:
 the buffer comprises a first buffer;
 the signal path comprises a first signal path; and
 the multiphase generator comprises:
  a first switch coupled to the first buffer and the first signal path;
  a second signal path; and
  a second switch coupled to the second signal path and a second buffer of the multiple buffers.

Example 8: The apparatus as recited in example 7 or any of the preceding examples, wherein the first switch is configured to selectively enable and disable an injection of the oscillation frequency of the oscillation signal to the first buffer via the first signal path.

Example 9: The apparatus as recited in example 8 or any of the preceding examples, wherein the multiphase generator is configured to provide the injection of the oscillation frequency of the oscillation signal via the first signal path using at least one current.

Example 10: The apparatus as recited in example 9 or any of the preceding examples, wherein the second switch is configured to selectively enable and disable an injection of the oscillation frequency of the oscillation signal to the second buffer via the second signal path.

Example 11: The apparatus as recited in example 10 or any of the preceding examples, wherein the multiphase generator is configured to provide the injection of the oscillation frequency of the oscillation signal via the second signal path using at least one voltage.

Example 12: The apparatus as recited in example 7 or any of the preceding examples, wherein:
 the first buffer comprises a control terminal and an output terminal;
 the first signal path is configured to inject the oscillation frequency of the oscillation signal using the control terminal of the first buffer; and
 the first buffer is configured to provide a signal to a succeeding buffer of the multiple buffers via the output terminal of the first buffer based on the oscillation frequency of the oscillation signal.

Example 13: The apparatus as recited in example 7 or any of the preceding examples, wherein:
 the second buffer comprises an input terminal and an output terminal;
 the second signal path is configured to directly inject the oscillation frequency of the oscillation signal into the multiple buffers via the input terminal of the second buffer; and
 the second buffer is configured to provide a signal to a succeeding buffer of the multiple buffers via the output terminal of the second buffer based on the oscillation frequency of the oscillation signal.

Example 14: The apparatus as recited in example 7 or any of the preceding examples, wherein:
   the multiphase generator comprises a multimodal multiphase generator; and
   the multimodal multiphase generator comprises single-ended circuitry.

Example 15: The apparatus as recited in example 7 or any of the preceding examples, wherein:
   the multiphase generator comprises a multimodal multiphase generator; and
   the multimodal multiphase generator comprises double-ended circuitry.

Example 16: The apparatus as recited in example 15 or any of the preceding examples, wherein the multimodal multiphase generator comprises:
   multiple tristate inverters coupled between a plus signal pathway and a minus signal pathway of the double-ended circuitry of the multimodal multiphase generator.

Example 17: The apparatus as recited in example 16 or any of the preceding examples, wherein the multimodal multiphase generator is configured to selectively enable or disable at least two tristate inverters of the multiple tristate inverters to respectively increase or decrease a signal coupling between the plus signal pathway and the minus signal pathway.

Example 18: The apparatus as recited in example 1 or any of the preceding examples, further comprising:
   a switch matrix circuit coupled between the multiphase generator and the reconfigurable frequency multiplier.

Example 19: The apparatus as recited in example 18 or any of the preceding examples, wherein the multiple phase components comprise:
   a plus in-phase (I+) component;
   a minus in-phase (I−) component;
   a plus quadrature (Q+) component; and
   a minus quadrature (Q−) component.

Example 20: The apparatus as recited in example 19 or any of the preceding examples, wherein the switch matrix circuit is configured to selectively swap at least one plus phase component with at least one minus phase component in conjunction with coupling the first signal from the multiphase generator to the reconfigurable frequency multiplier.

Example 21: The apparatus as recited in example 1 or any of the preceding examples, wherein the reconfigurable frequency multiplier is configured to multiply the first frequency by a factor of multiple factors to produce the second frequency of the second signal.

Example 22: The apparatus as recited in example 21 or any of the preceding examples, wherein the multiple factors comprise two (2) and three (3).

Example 23: The apparatus as recited in example 1 or any of the preceding examples, wherein the reconfigurable frequency multiplier comprises:
   a Gilbert cell comprising a plus portion and a minus portion; and
   a switch coupled between the plus portion and the minus portion of the Gilbert cell.

Example 24: The apparatus as recited in example 23 or any of the preceding examples, wherein:
   the Gilbert cell comprises a double-balanced Gilbert cell;
   the Gilbert cell comprises a first stage and a second stage; and
   the switch is coupled between the first stage and the second stage of the Gilbert cell.

Example 25: The apparatus as recited in example 1 or any of the preceding examples, wherein the reconfigurable frequency multiplier comprises:
   a first transistor;
   a second transistor;
   a third transistor coupled between the first transistor and a plus output of the reconfigurable frequency multiplier;
   a fourth transistor coupled between the first transistor and a minus output of the reconfigurable frequency multiplier;
   a fifth transistor coupled between the second transistor and the plus output of the reconfigurable frequency multiplier;
   a sixth transistor coupled between the second transistor and the minus output of the reconfigurable frequency multiplier; and
   a switch coupled between the first transistor and the second transistor.

Example 26: The apparatus as recited in example 25 or any of the preceding examples, wherein:
   each gate of the first, second, third, fourth, fifth, and sixth transistors is coupled to at least one output of the multiphase generator;
   the switch is coupled between a channel terminal of the first transistor and a channel terminal of the second transistor; and
   the reconfigurable frequency multiplier is configured to selectively:
      multiply the first frequency of the first signal by two (2) to produce the second frequency of the second signal based on the switch being in an open state; or
      multiply the first frequency of the first signal by three (3) to produce the second frequency of the second signal based on the switch being in a closed state.

Example 27: An apparatus for generating a frequency, the apparatus comprising:
   means for generating a first signal comprising multiple phase components and having a first frequency based on an oscillation signal having an oscillation frequency; and
   means for multiplying, based on a factor of multiple factors, the first frequency of the first signal to produce a second signal having a second frequency that is a multiple of the first frequency.

Example 28: The apparatus as recited in example 27, further comprising:
   means for selectively coupling the multiple phase components from the means for generating to the means for multiplying based on the factor of the multiple factors.

Example 29: The apparatus as recited in example 27 or example 28, wherein the means for generating comprises:
   means for injecting the oscillation frequency of the oscillation signal into multiple buffers using a current to generate the first signal having the first frequency, the first frequency corresponding to a subharmonic frequency of the oscillation frequency.

Example 30: The apparatus as recited in example 27 or any of examples 28 to 29, wherein the means for generating comprises:
   means for injecting the oscillation frequency of the oscillation signal into multiple buffers using a voltage to generate the first signal having the first frequency, the first frequency corresponding to the oscillation frequency.

Example 31: The apparatus as recited in example 27 or any of examples 28 to 30, wherein the means for multiplying comprises:
   means for transforming a frequency doubler circuit into a frequency tripler circuit.

Example 32: A method for generating a frequency, the method comprising:
propagating an oscillation signal having an oscillation frequency through a multimode frequency multiplier to produce a first signal having a first frequency, comprising:
generating multiple phase components having a third frequency; and
multiplying the third frequency by a first factor of multiple factors, the first frequency based on the third frequency and the first factor;
changing a state of at least one switch of the multimode frequency multiplier; and
responsive to the changing of the state, propagating the oscillation signal having the oscillation frequency through the multimode frequency multiplier to produce a second signal having a second frequency, comprising:
generating the multiple phase components having the third frequency; and
multiplying the third frequency by a second factor of the multiple factors, the second frequency based on the third frequency and the second factor.
Example 33: The method as recited in example 32, further comprising:
changing a state of at least one other switch of the multimode frequency multiplier; and
responsive to the changing of the state of the at least one other switch, propagating the oscillation signal having the oscillation frequency through the multimode frequency multiplier to produce a third signal having a fourth frequency, comprising:
generating the multiple phase components having a fifth frequency; and
multiplying the fifth frequency by the first factor or the second factor of the multiple factors, the fourth frequency based on the fifth frequency and the first factor or the second factor.

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire. A coupling can include a direct coupling or an indirect coupling. A direct coupling refers to connecting discrete circuit elements via a same node without an intervening element. An indirect coupling refers to connecting discrete circuit elements via one or more other devices or other discrete circuit elements, including two or more different nodes.

The terms "first," "second," "third," and other numeric-related indicators are used herein to identify or distinguish similar or analogous items from one another within a given context—such as a particular implementation, a single drawing figure, a given component, or a claim. Thus, a first item in one context may differ from a first item in another context. For example, an item identified as a "first signal" or a "first buffer" in one context may be identified as a "second signal" or a "second buffer," respectively, in another context. Similarly, a "first phase component" in one claim may be recited as a "second phase component" in a different claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for generating a frequency, the apparatus comprising:
a multimode frequency multiplier comprising:
a multiphase generator configured to produce a first signal comprising multiple phase components and having a first frequency; and
a reconfigurable frequency multiplier coupled in series with the multiphase generator, the reconfigurable frequency multiplier configured to produce a second signal based on the first signal and having a second frequency that is a multiple of the first frequency, the reconfigurable frequency multiplier comprising:
a Gilbert cell comprising a plus portion, a minus portion, a first stage, and a second stage; and
a switch coupled between the plus portion and the minus portion of the Gilbert cell, the switch coupled between the first stage and the second stage of the Gilbert cell via the plus portion and the minus portion of the Gilbert cell.

2. The apparatus as recited in claim 1, wherein:
the multiphase generator comprises a multimodal multiphase generator configured to selectively adjust the first frequency.

3. The apparatus as recited in claim 2, wherein the multimodal multiphase generator is configured to:
produce the first signal having the first frequency based on an oscillating signal having a fundamental frequency; and
adjust the first frequency between two or more frequency values.

4. The apparatus as recited in claim 3, wherein the two or more frequency values comprise approximately the fundamental frequency and approximately a subharmonic frequency of the fundamental frequency.

5. The apparatus as recited in claim 1, wherein the multiphase generator comprises:
multiple buffers coupled together in series,
wherein a buffer of the multiple buffers is coupled to a signal path corresponding to an oscillation signal having an oscillation frequency.

6. The apparatus as recited in claim 5, wherein:
the buffer comprises a first buffer;
the signal path comprises a first signal path; and
the multiphase generator comprises:
a first switch coupled to the first buffer and the first signal path;
a second signal path; and a second switch coupled to the second signal path and a second buffer of the multiple buffers.

7. The apparatus as recited in claim 6, wherein:
the first switch is configured to selectively enable and disable an injection of the oscillation frequency of the oscillation signal to the first buffer via the first signal path; and
the multiphase generator is configured to provide the injection of the oscillation frequency of the oscillation signal via the first signal path using at least one current.

8. The apparatus as recited in claim 7, wherein:
the second switch is configured to selectively enable and disable an injection of the oscillation frequency of the oscillation signal to the second buffer via the second signal path; and
the multiphase generator is configured to provide the injection of the oscillation frequency of the oscillation signal via the second signal path using at least one voltage.

9. The apparatus as recited in claim 6, wherein:
the first buffer comprises a control terminal and an output terminal;
the first signal path is configured to inject the oscillation frequency of the oscillation signal using the control terminal of the first buffer; and
the first buffer is configured to provide a signal to a succeeding buffer of the multiple buffers via the output terminal of the first buffer based on the oscillation frequency of the oscillation signal.

10. The apparatus as recited in claim 6, wherein:
the second buffer comprises an input terminal and an output terminal;
the second signal path is configured to directly inject the oscillation frequency of the oscillation signal into the multiple buffers via the input terminal of the second buffer; and
the second buffer is configured to provide a signal to a succeeding buffer of the multiple buffers via the output terminal of the second buffer based on the oscillation frequency of the oscillation signal.

11. The apparatus as recited in claim 6, wherein:
the multiphase generator comprises a multimodal multiphase generator; and
the multimodal multiphase generator comprises single-ended circuitry.

12. The apparatus as recited in claim 6, wherein:
the multiphase generator comprises a multimodal multiphase generator; and
the multimodal multiphase generator comprises double-ended circuitry.

13. The apparatus as recited in claim 12, wherein the multimodal multiphase generator comprises:
multiple tristate inverters coupled between a plus signal pathway and a minus signal pathway of the double-ended circuitry of the multimodal multiphase generator.

14. The apparatus as recited in claim 13, wherein the multimodal multiphase generator is configured to selectively enable or disable at least two tristate inverters of the multiple tristate inverters to respectively increase or decrease a signal coupling between the plus signal pathway and the minus signal pathway.

15. The apparatus as recited in claim 1, further comprising:
a switch matrix circuit coupled between the multiphase generator and the reconfigurable frequency multiplier.

16. The apparatus as recited in claim 15, wherein the multiple phase components comprise:

a plus in-phase (I+) component;
a minus in-phase (I−) component;
a plus quadrature (Q+) component; and
a minus quadrature (Q−) component, wherein the switch matrix circuit is configured to selectively swap at least one plus phase component with at least one minus phase component in conjunction with coupling the first signal from the multiphase generator to the reconfigurable frequency multiplier.

17. The apparatus as recited in claim 1, wherein the reconfigurable frequency multiplier is configured to multiply the first frequency by a factor of multiple factors to produce the second frequency of the second signal.

18. The apparatus as recited in claim 17, wherein the multiple factors comprise two (2) and three (3).

19. The apparatus as recited in claim 1, wherein the switch is coupled in parallel with and between the first stage and the second stage of the Gilbert cell via the plus portion and the minus portion of the Gilbert cell.

20. The apparatus as recited in claim 1, wherein:
the Gilbert cell comprises a double-balanced Gilbert cell;
the plus portion overlaps the first stage and the second stage of the double-balanced Gilbert cell; and
the minus portion overlaps the first stage and the second stage of the double-balanced Gilbert cell.

21. The apparatus as recited in claim 1, wherein the Gilbert cell of the reconfigurable frequency multiplier comprises:
a first transistor;
a second transistor;
a third transistor coupled between the first transistor and a plus output of the reconfigurable frequency multiplier;
a fourth transistor coupled between the first transistor and a minus output of the reconfigurable frequency multiplier;
a fifth transistor coupled between the second transistor and the plus output of the reconfigurable frequency multiplier; and
a sixth transistor coupled between the second transistor and the minus output of the reconfigurable frequency multiplier,
the switch coupled between the first transistor and the second transistor.

22. The apparatus as recited in claim 21, wherein:
each gate of the first, second, third, fourth, fifth, and sixth transistors is coupled to at least one output of the multiphase generator;
the switch is coupled between a channel terminal of the first transistor and a channel terminal of the second transistor; and
the reconfigurable frequency multiplier is configured to selectively:
multiply the first frequency of the first signal by two (2) to produce the second frequency of the second signal based on the switch being in an open state; or
multiply the first frequency of the first signal by three (3) to produce the second frequency of the second signal based on the switch being in a closed state.

23. An apparatus for generating a frequency, the apparatus comprising:
means for generating a first signal comprising multiple phase components and having a first frequency based on an oscillation signal having an oscillation frequency; and
means for multiplying, based on a factor of multiple factors, the first frequency of the first signal to produce a second signal having a second frequency that is a multiple of the first frequency, the means for multiplying comprising:
means for transforming a frequency doubler circuit into a frequency tripler circuit.

24. The apparatus as recited in claim 23, further comprising:
means for selectively coupling the multiple phase components from the means for generating to the means for multiplying based on the factor of the multiple factors.

25. The apparatus as recited in claim 23, wherein the means for generating comprises:
means for injecting the oscillation frequency of the oscillation signal into multiple buffers using a current to generate the first signal having the first frequency, the first frequency corresponding to a subharmonic frequency of the oscillation frequency.

26. The apparatus as recited in claim 23, wherein the means for generating comprises:
means for injecting the oscillation frequency of the oscillation signal into multiple buffers using a voltage to generate the first signal having the first frequency, the first frequency corresponding to the oscillation frequency.

27. A method for generating a frequency, the method comprising:
propagating an oscillation signal having an oscillation frequency through a multimode frequency multiplier to produce a first signal having a first frequency, comprising:
generating multiple phase components having a third frequency; and
multiplying the third frequency by a first factor of multiple factors, the first frequency based on the third frequency and the first factor;
changing a state of at least one switch of the multimode frequency multiplier, the at least one switch coupled between a plus portion and a minus portion of a Gilbert cell, the at least one switch coupled between a first stage and a second stage of the Gilbert cell via the plus portion and the minus portion of the Gilbert cell; and
propagating the oscillation signal having the oscillation frequency through the multimode frequency multiplier to produce a second signal having a second frequency based on the changing of the state, comprising:
generating the multiple phase components having the third frequency; and
multiplying the third frequency by a second factor of the multiple factors, the second frequency based on the third frequency and the second factor.

28. The method as recited in claim 27, further comprising:
changing a state of at least one other switch of the multimode frequency multiplier; and
propagating the oscillation signal having the oscillation frequency through the multimode frequency multiplier to produce a third signal having a fourth frequency based on the changing of the state of the at least one other switch, comprising:
generating the multiple phase components having a fifth frequency; and
multiplying the fifth frequency by the first factor or the second factor of the multiple factors, the fourth frequency based on the fifth frequency and the first factor or the second factor.

29. The apparatus as recited in claim 1, wherein:
the first stage comprises a transconductance stage of the Gilbert cell; and
the second stage comprises a switching stage of the Gilbert cell.

30. The apparatus as recited in claim 21, wherein:
the plus portion of the Gilbert cell comprises the first transistor and the third transistor; and
the minus portion of the Gilbert cell comprises the second transistor and the sixth transistor.

31. The apparatus as recited in claim 30, wherein:
the first stage of the Gilbert cell comprises the first transistor and the second transistor; and
the second stage of the Gilbert cell comprises the third transistor, the fourth transistor, the fifth transistor, and the sixth transistor.

32. An apparatus for generating a frequency, the apparatus comprising:
a multimode frequency multiplier comprising:
a multiphase generator configured to produce a first signal comprising multiple phase components and having a first frequency; and
a reconfigurable frequency multiplier coupled in series with the multiphase generator, the reconfigurable frequency multiplier configured to produce a second signal based on the first signal and having a second frequency that is a multiple of the first frequency, the reconfigurable frequency multiplier comprising:
a first transistor;
a second transistor;
a third transistor coupled between the first transistor and a plus output of the reconfigurable frequency multiplier;
a fourth transistor coupled between the first transistor and a minus output of the reconfigurable frequency multiplier;
a fifth transistor coupled between the second transistor and the plus output of the reconfigurable frequency multiplier;
a sixth transistor coupled between the second transistor and the minus output of the reconfigurable frequency multiplier; and
a switch coupled between the first transistor and the second transistor.

33. The apparatus as recited in claim 32, wherein:
each gate of the first, second, third, fourth, fifth, and sixth transistors is coupled to at least one output of the multiphase generator;
the switch is coupled between a channel terminal of the first transistor and a channel terminal of the second transistor; and
the reconfigurable frequency multiplier is configured to selectively:
multiply the first frequency of the first signal by two (2) to produce the second frequency of the second signal based on the switch being in an open state; or
multiply the first frequency of the first signal by three (3) to produce the second frequency of the second signal based on the switch being in a closed state.

* * * * *